United States Patent
Lin et al.

(10) Patent No.: US 12,426,420 B2
(45) Date of Patent: Sep. 23, 2025

(54) LIGHT-EMITTING DIODE ELEMENT AND METHOD FOR MANUFACTURING DISPLAY APPARATUS

(71) Applicant: AUO Corporation, Hsinchu (TW)

(72) Inventors: Shih-Hsiung Lin, Hsinchu (TW); Yang-En Wu, Hsinchu (TW)

(73) Assignee: AUO Corporation, Hsinchu (JP)

( * ) Notice: Subject to any disclaimer, the term of this patent is extended or adjusted under 35 U.S.C. 154(b) by 474 days.

(21) Appl. No.: 17/875,448

(22) Filed: Jul. 28, 2022

(65) Prior Publication Data

US 2023/0378409 A1 Nov. 23, 2023

(30) Foreign Application Priority Data

May 19, 2022 (TW) .................................. 111118688

(51) Int. Cl.
*H01L 23/00* (2006.01)
*H10H 20/857* (2025.01)
*H10H 20/01* (2025.01)

(52) U.S. Cl.
CPC ........... *H10H 20/857* (2025.01); *H01L 24/05* (2013.01); *H01L 24/13* (2013.01); *H01L 24/81* (2013.01);
(Continued)

(58) Field of Classification Search
CPC ............ H10H 20/857; H10H 20/0364; H10H 20/841; H10H 20/00; H10H 20/84; H01L 24/05; H01L 24/13; H01L 24/81; H01L 2224/05155; H01L 2224/05647; H01L 2224/13111; H01L 2224/13139;
(Continued)

(56) References Cited

U.S. PATENT DOCUMENTS 6,605,524 B1 * 8/2003 Fan ......................... H01L 24/05
257/E21.508
9,434,150 B2 9/2016 Bower et al.
(Continued)

FOREIGN PATENT DOCUMENTS

CN 112331641 2/2021
CN 110544704 4/2022
(Continued)

*Primary Examiner* — Wael M Fahmy
*Assistant Examiner* — Fernando Jose Ramos-Diaz
(74) *Attorney, Agent, or Firm* — JCIPRNET

(57) ABSTRACT

A light-emitting diode element includes a first-type semiconductor layer, a second-type semiconductor layer, an active layer, an insulating layer, a first electrode, a second electrode, a first passivation layer, a first seed layer, a first electroplating layer, a first solder and second solder. The insulating layer covers a sidewall of the first-type semiconductor layer, a sidewall of the second-type semiconductor layer and a sidewall of the active layer. The first passivation layer covers a portion of the insulating layer on the sidewall of the first-type semiconductor layer, the sidewall of the second-type semiconductor layer and the sidewall of the active layer. The first seed layer is disposed on the first passivation layer. The first electroplating layer is disposed on the first seed layer. The first solder and the second solder are electrically connected to a first conductive pattern and a second conductive pattern of the first electroplating layer.

8 Claims, 22 Drawing Sheets

(52) U.S. Cl.
CPC ............... *H01L 2224/05155* (2013.01); *H01L 2224/05647* (2013.01); *H01L 2224/13111* (2013.01); *H01L 2224/13139* (2013.01); *H01L 2224/81815* (2013.01); *H01L 2924/014* (2013.01); *H10H 20/0364* (2025.01)

(58) Field of Classification Search
CPC ..... H01L 2224/81815; H01L 2924/014; H01L 24/11; H01L 25/0753; H01L 25/50; H01L 24/14; H01L 2221/1084; H10D 30/0295; H10D 8/043; H10D 84/8316; H10D 30/509; F27D 17/30; A61K 40/4272; A01N 1/146
USPC ........................................................ 257/211
See application file for complete search history.

(56) References Cited

U.S. PATENT DOCUMENTS

| | | | |
|---|---|---|---|
| 2021/0091057 A1 | 3/2021 | Liang et al. | |
| 2021/0305209 A1* | 9/2021 | Chen | .................. H01L 23/3171 |
| 2022/0085265 A1 | 3/2022 | Lee et al. | |

FOREIGN PATENT DOCUMENTS

| | | |
|---|---|---|
| CN | 114300597 | 4/2022 |
| JP | 5017930 | 9/2012 |
| KR | 100702430 | 3/2007 |
| KR | 20200137247 | 12/2020 |
| TW | 545098 | 8/2003 |
| TW | I293643 | 2/2008 |
| TW | I318015 | 12/2009 |

\* cited by examiner

LIGHT-EMITTING DIODE ELEMENT AND METHOD FOR MANUFACTURING DISPLAY APPARATUS

CROSS-REFERENCE TO RELATED APPLICATION

This application claims the priority benefit of Taiwan application serial no. 111118688, filed on May 19, 2022. The entirety of the above-mentioned patent applications is hereby incorporated by reference herein and made a part of this specification.

BACKGROUND

Technical Field

The disclosure relates to a semiconductor element and a method for manufacturing a semiconductor apparatus, and in particular relates to a light-emitting diode element and a method for manufacturing a display apparatus.

Description of Related Art

A light-emitting diode display panel includes a driving backplane and multiple light-emitting diode elements which are transferred on the driving backplane. Inheriting the characteristics of light-emitting diodes, light-emitting diode display panels have the advantages of power saving, high efficiency, high brightness, and fast response time. Compared with organic light-emitting diode display panels, light-emitting diode display panels also have the advantages of easy color adjustment, long light-emitting lifetime, and no image burn-in. Therefore, the light-emitting diode display panel is regarded as the next generation display technology. However, voids are likely to appear on the interface between the light-emitting diode element and the driving backplane, which affects the reliability of the light-emitting diode display apparatus.

SUMMARY

The disclosure provides a light-emitting diode element with good characteristics.

The disclosure provides a method for manufacturing a display apparatus, which may improve the yield rate.

The light-emitting diode element of the disclosure includes a first-type semiconductor layer, a second-type semiconductor layer, an active layer, an insulating layer, a first electrode, a second electrode, a first passivation layer, a first seed layer, a first electroplating layer, a first solder, and a second solder. The second-type semiconductor layer is disposed on the first-type semiconductor layer. The active layer is disposed between the first-type semiconductor layer and the second-type semiconductor layer. The insulating layer is disposed on a surface of the second-type semiconductor layer and covers a sidewall of the first-type semiconductor layer, a sidewall of the second-type semiconductor layer, and a sidewall of the active layer. The first electrode and the second electrode are respectively electrically connected to the first-type semiconductor layer and the second-type semiconductor layer. The first passivation layer covers at least a portion of the insulating layer located on the sidewall of the first-type semiconductor layer, the sidewall of the second-type semiconductor layer, and has a first opening and a second opening respectively overlapping the first electrode and the second electrode. The first seed layer is disposed on the first passivation layer, and has a first conductive pattern and a second conductive pattern that are structurally separated from one another, the first conductive pattern and the second conductive pattern of the first seed layer are respectively electrically connected to the first electrode and the second electrode through the first opening and the second opening of the first passivation layer. The first electroplating layer is disposed on the first seed layer, and has a first conductive pattern and a second conductive pattern that are structurally separated from one another. The first conductive pattern and the second conductive pattern of the first electroplating layer are respectively disposed on the first conductive pattern and the second conductive pattern of the first seed layer and are respectively electrically connected to the first conductive pattern and the second conductive pattern of the first seed layer. The first solder and the second solder are respectively electrically connected to the first conductive pattern and the second conductive pattern of the first electroplating layer.

A method for manufacturing a display apparatus of the disclosure includes the following process. A driving backplane is provided, the driving backplane has multiple pad groups. A temporary adhesive layer is formed on the driving backplane. After the temporary adhesive layer is formed on the driving backplane, multiple light-emitting diode elements are placed on the driving backplane, and the light-emitting diode elements are electrically connected to the pad groups of the driving backplane. A reflow process is performed so that the light-emitting diode elements self-align to the pad groups of the driving backplane.

In an embodiment of the disclosure, the first conductive pattern of the first seed layer is smaller than the first conductive pattern of the first electroplating layer, and the second conductive pattern of the first seed layer is smaller than the second conductive pattern of the first electroplating layer.

In an embodiment of the disclosure, the light-emitting diode element further includes a second passivation layer disposed on the first electroplating layer and the first passivation layer, and has a first opening and a second opening respectively overlapping the first conductive pattern and the second conductive pattern of the first electroplating layer.

In an embodiment of the disclosure, the light-emitting diode element further includes a second seed layer disposed on the second passivation layer, and has a first conductive pattern and a second conductive pattern that are structurally separated from one another. The first conductive pattern and the second conductive pattern of the second seed layer are respectively electrically connected to the first conductive pattern and the second conductive pattern of the first electroplating layer through the first opening and the second opening of the second passivation layer.

In an embodiment of the disclosure, the light-emitting diode element further includes a second electroplating layer disposed on the second seed layer, and has a first conductive pattern and a second conductive pattern that are structurally separated from one another. The first conductive pattern and the second conductive pattern of the second electroplating layer are respectively disposed on the first conductive pattern and the second conductive pattern of the second seed layer and are respectively electrically connected to the first conductive pattern and the second conductive pattern of the second seed layer.

In an embodiment of the disclosure, the first conductive pattern of the second seed layer is smaller than the first conductive pattern of the second electroplating layer, and the second conductive pattern of the second seed layer is smaller than the second conductive pattern of the second electroplating layer.

In an embodiment of the disclosure, the first solder and the second solder respectively directly contact the first conductive pattern and the second conductive pattern of the second electroplating layer.

In an embodiment of the disclosure, the first conductive pattern of the second electroplating layer includes a first portion and a second portion that are structurally separated from one another, and the first portion and the second portion of the first conductive pattern of the second electroplating layer are electrically connected to the same first conductive pattern of the first electroplating layer.

In an embodiment of the disclosure, the second conductive pattern of the second electroplating layer includes a first portion and a second portion that are structurally separated from one another, and the first portion and the second portion of the second conductive pattern of the second electroplating layer are electrically connected to the same second conductive pattern of the first electroplating layer.

In an embodiment of the disclosure, after the light-emitting diode element is electrically connected to the pad groups of the driving backplane, a portion of the temporary adhesive layer remains on the driving backplane; when the reflow process is performed, the portion of the temporary adhesive layer remaining on the driving backplane is removed.

In an embodiment of the disclosure, the reflow process includes the following process. Gas is introduced to remove the portion of the temporary adhesive layer remaining on the driving backplane.

In an embodiment of the disclosure, the gas includes hydrogen or formic acid.

DETAILED DESCRIPTION OF DISCLOSED EMBODIMENTS

Figure 1A:
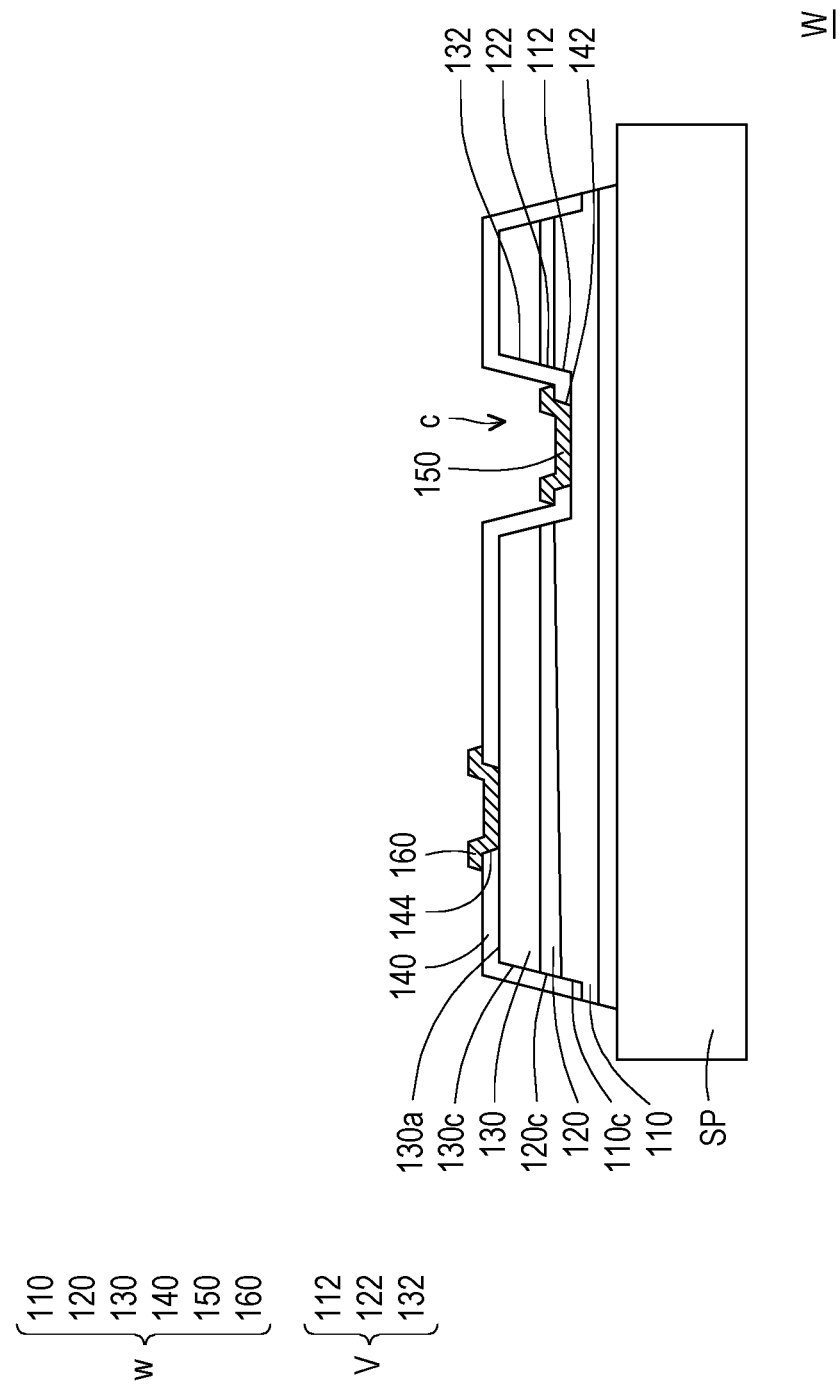
FIG. 1A to FIG. 1N are cross-sectional schematic views showing a manufacturing process of a light-emitting diode element 10 according to an embodiment of the disclosure.

References of the exemplary embodiments of the disclosure are to be made in detail. Examples of the exemplary embodiments are illustrated in the drawings. If applicable, the same reference numerals in the drawings and the descriptions indicate the same or similar parts.

It should be understood that when an element such as a layer, a film, an area, or a substrate is indicated to be "on" another element or "connected to" another element, it may be directly on another element or connected to another element, or an element in the middle may exist. In contrast, when an element is indicated to be "directly on another element" or "directly connected to" another element, an element in the middle does not exist. As used herein, "to connect" may indicate to physically and/or electrically connect. Furthermore, "to electrically connect" or "to couple" may also be used when other elements exist between two elements.

The usages of "approximately", "similar to", or "substantially" indicated throughout the specification include the indicated value and an average value having an acceptable deviation range, which is a certain value confirmed by people skilled in the art, and is a certain amount considered the discussed measurement and measurement-related deviation (that is, the limitation of measurement system). For example, "approximately" may indicate to be within one or more standard deviations of the indicated value, or being within ±30%, ±20%, ±10%, or ±5%. Furthermore, the usages of "approximately", "similar to", or "substantially" indicated throughout the specification may refer to a more acceptable deviation scope or standard deviation depending on optical properties, etching properties, or other properties, and all properties may not be applied with one standard deviation.

Unless otherwise defined, all terms (including technical and scientific terms) used herein have the same meaning as that commonly understood by one of ordinary skill in the art to which this disclosure belongs. It should be further understood that terms such as those defined in commonly used dictionaries should be construed as having meanings consistent with their meanings in the context of the related art and the disclosure, and are not to be construed as idealized or excessive formal meaning, unless expressly defined as such herein.

Figure 1B:
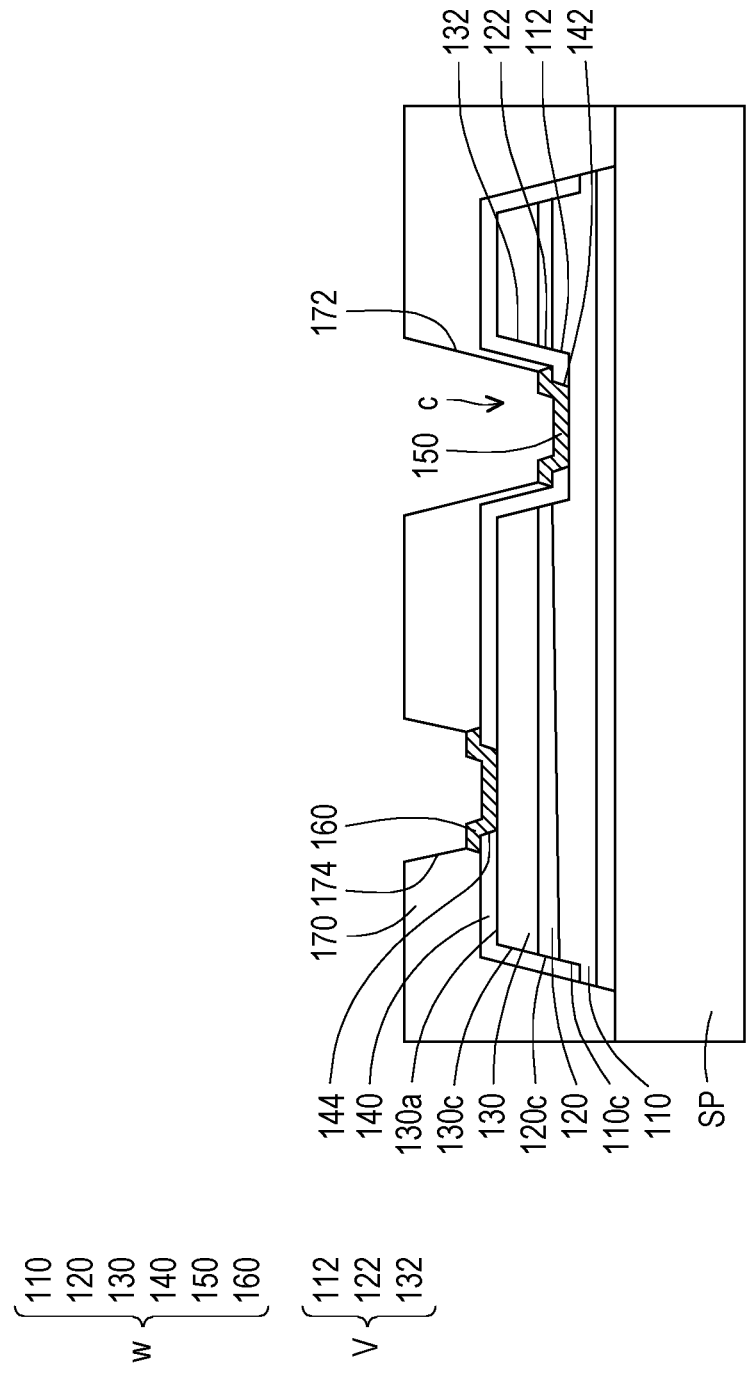
Figure 1C:
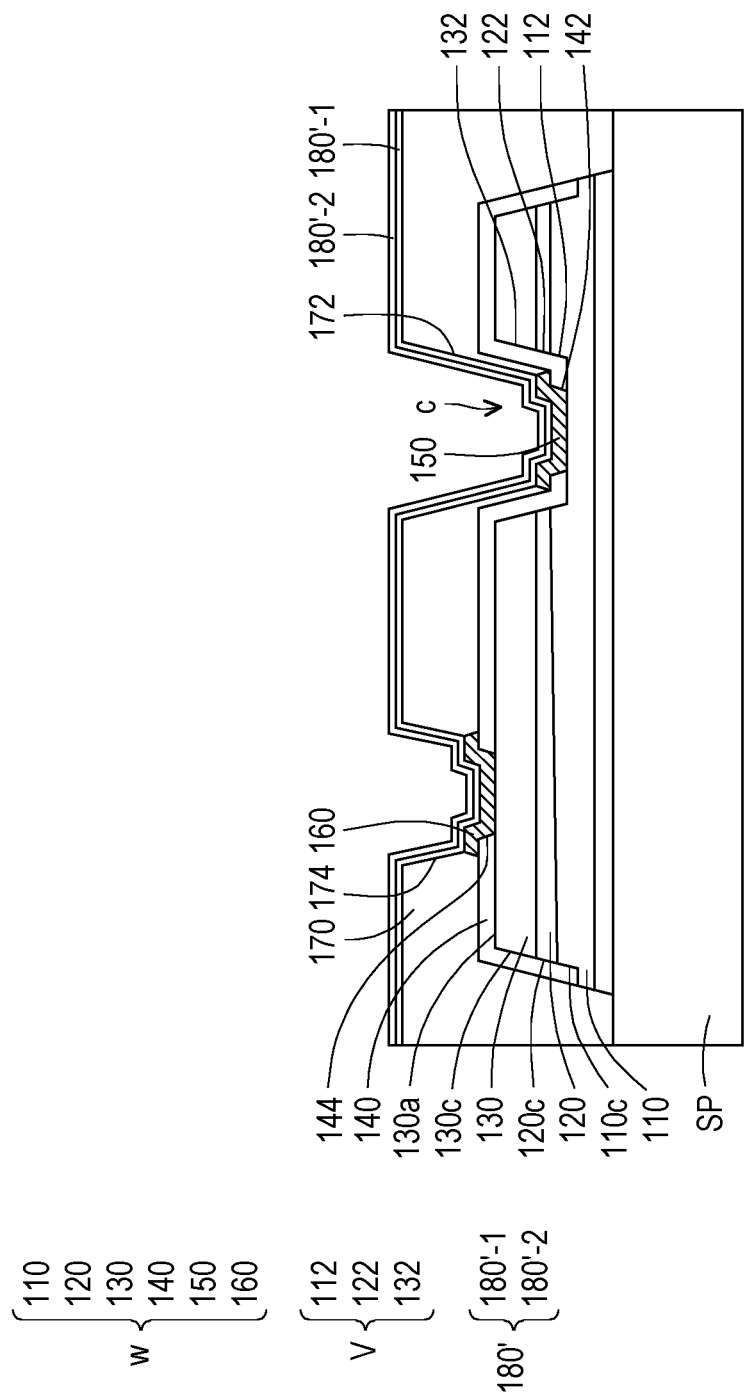
Figure 1D:
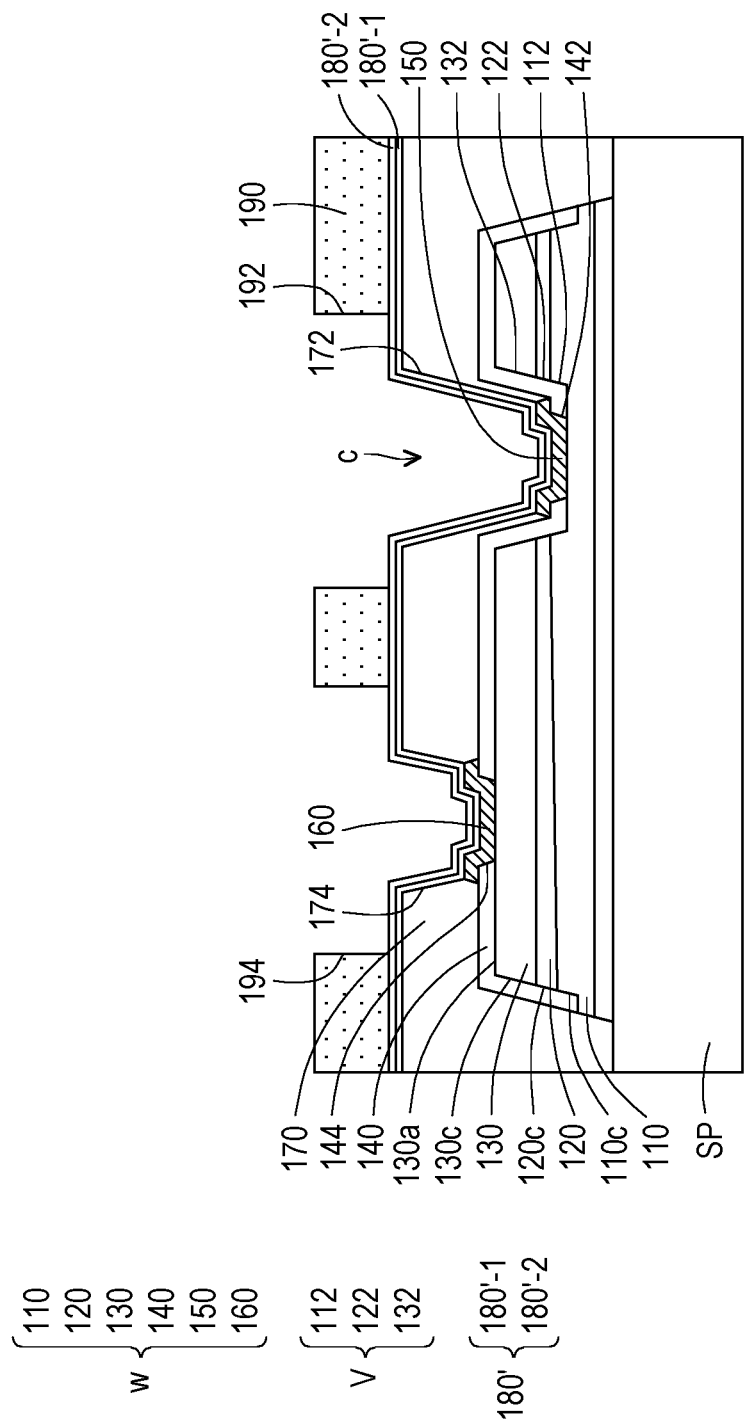
Figure 1E:
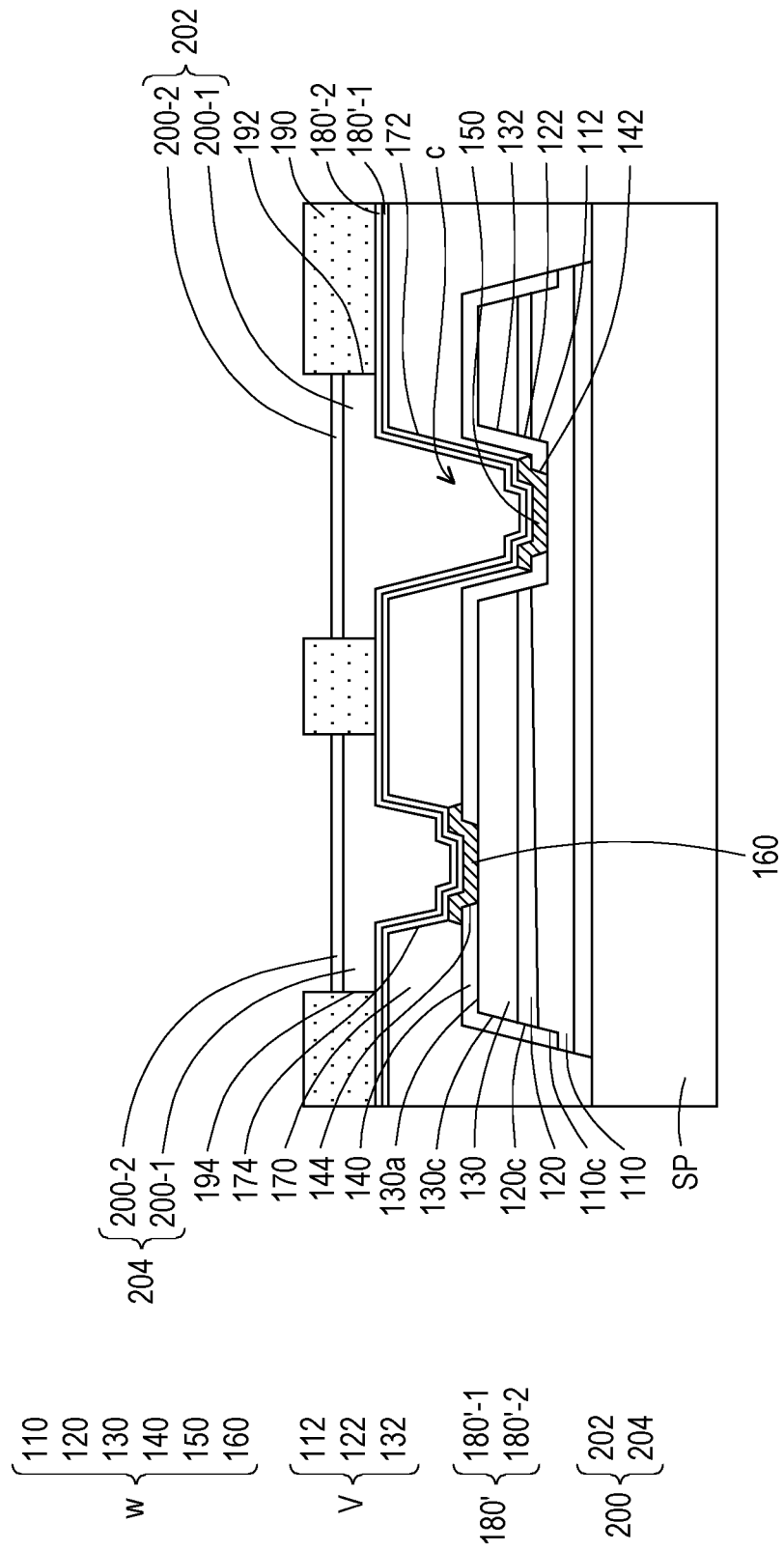
Figure 1F:
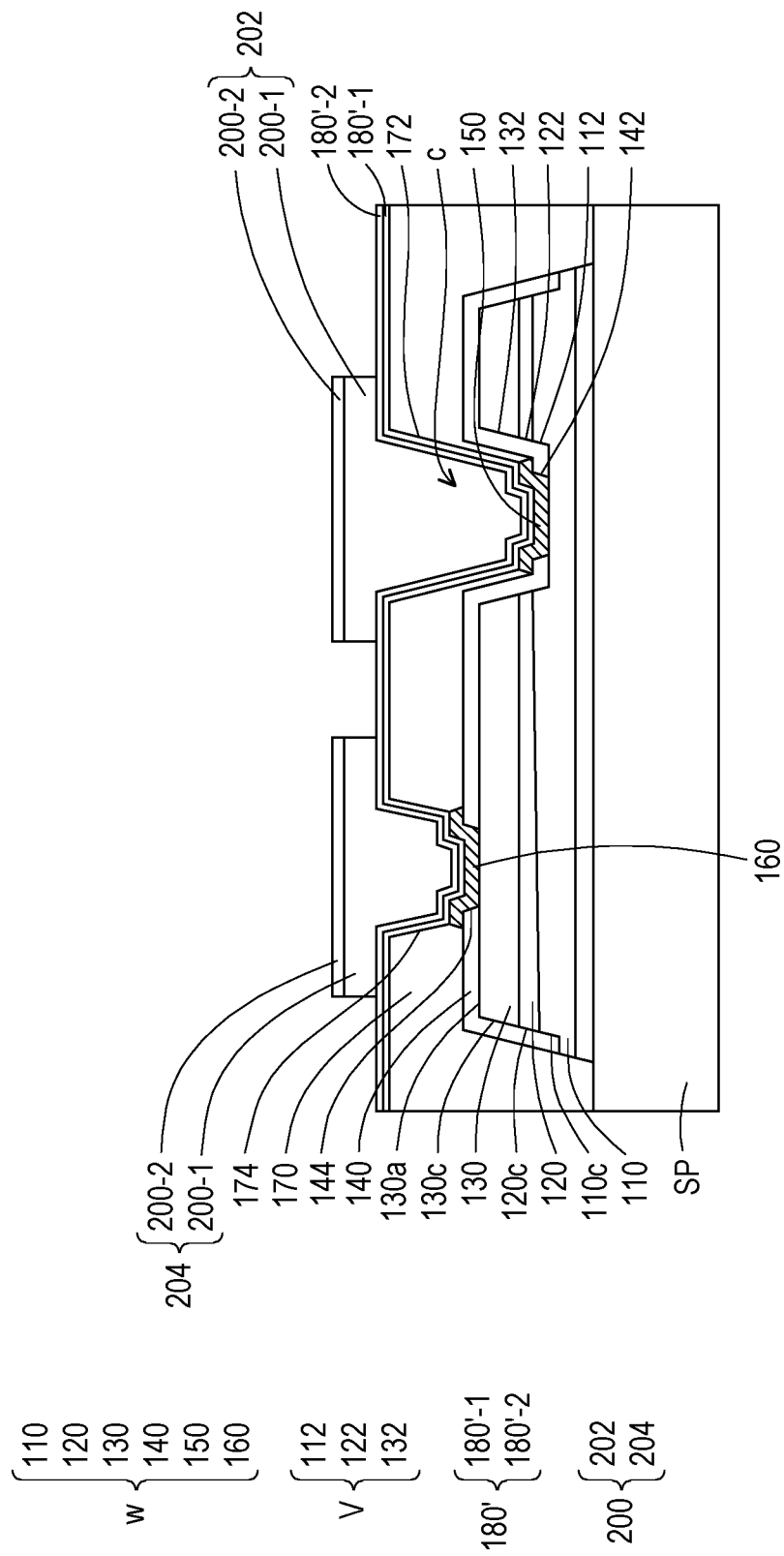
Figure 1G:
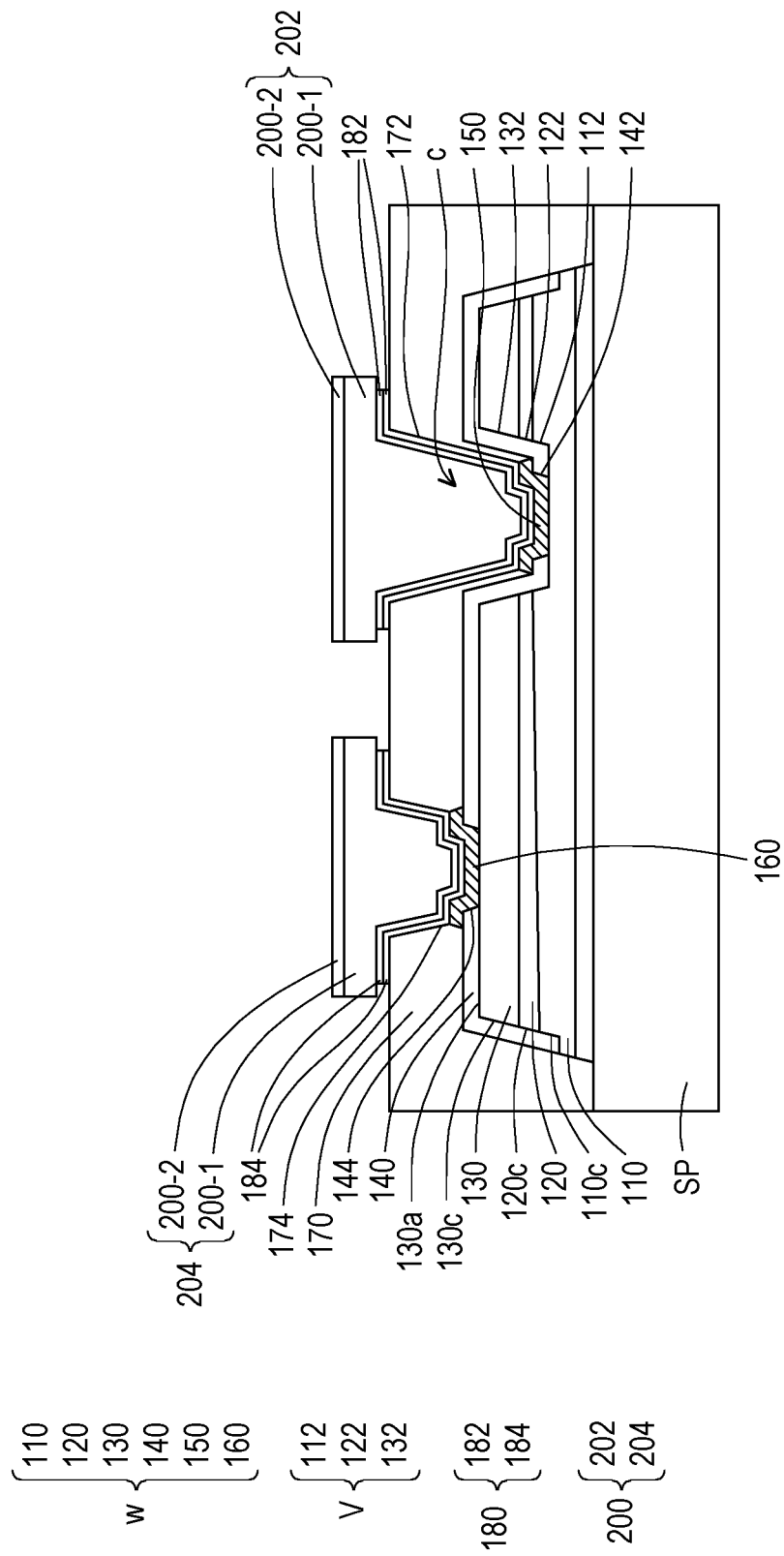
Figure 1H:
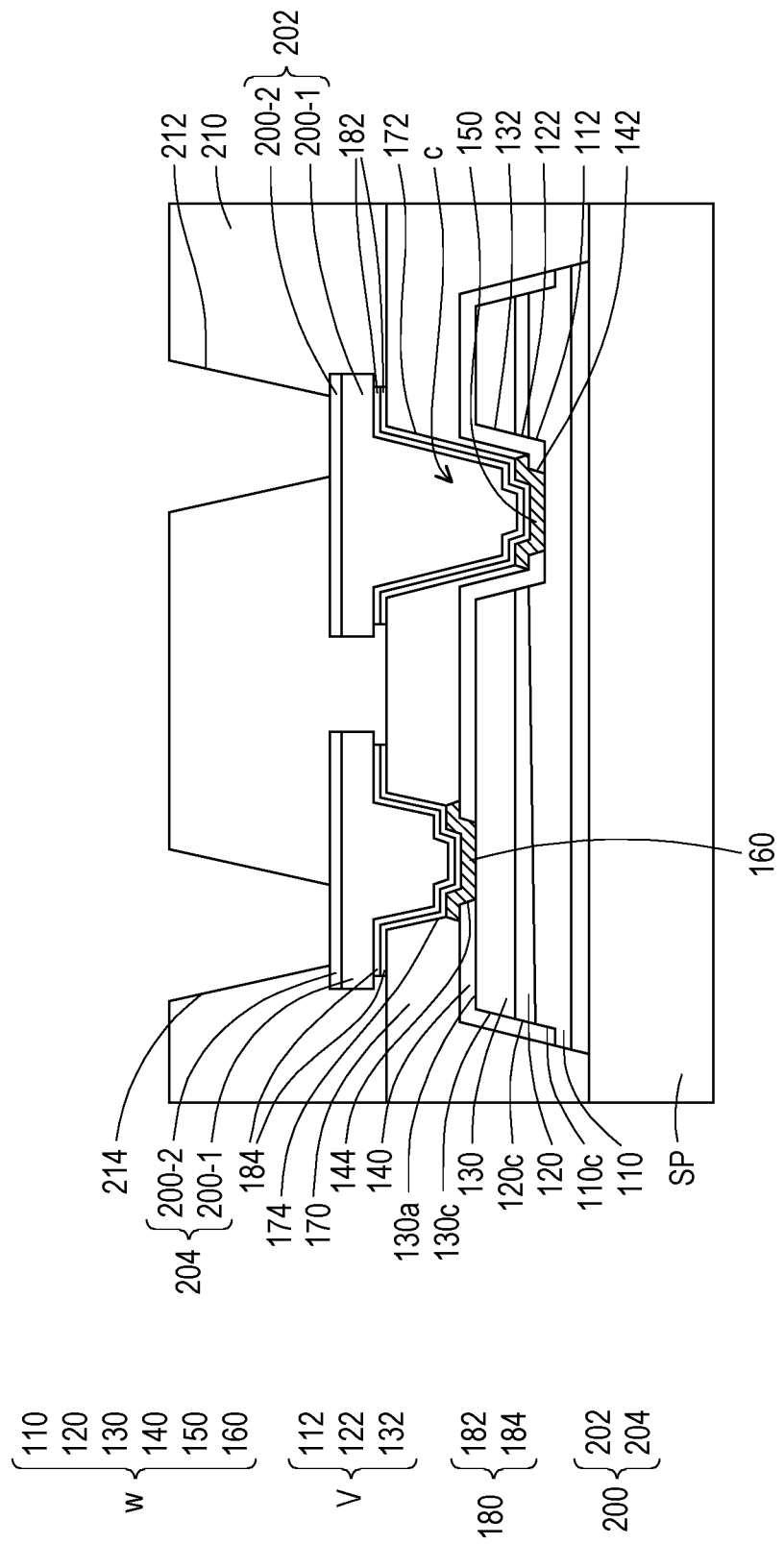
Figure 1I:
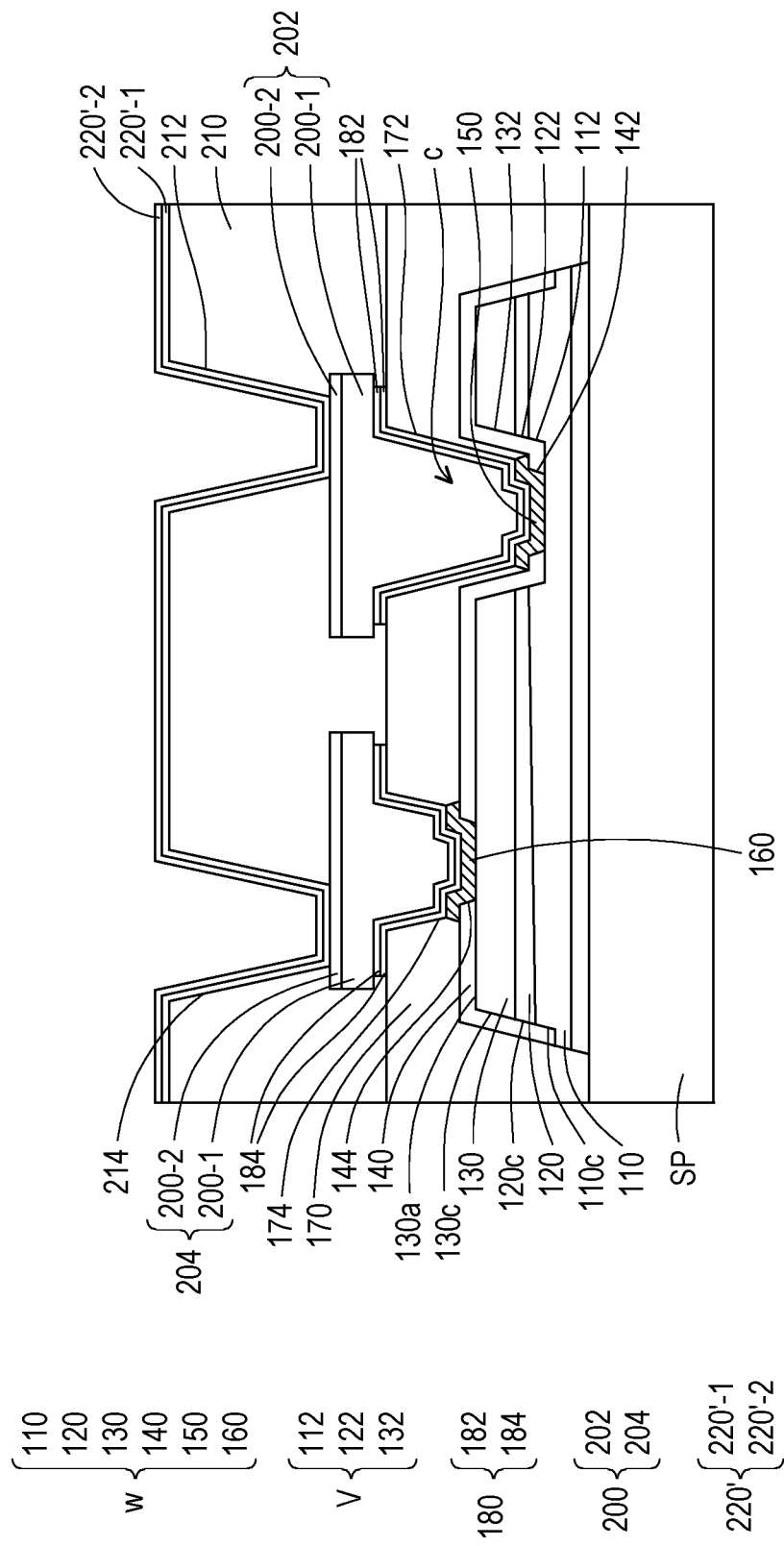
Figure 1J:
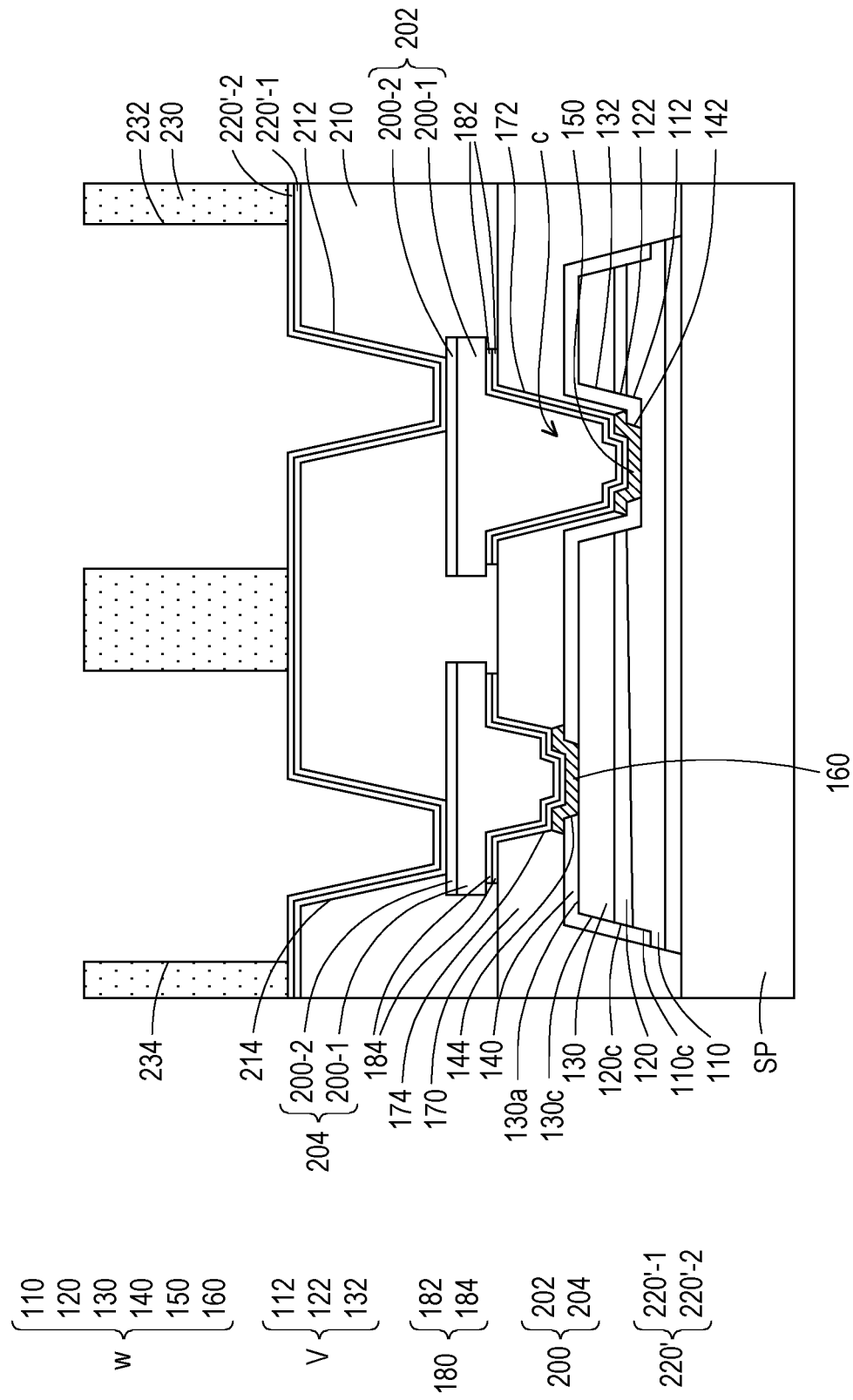
Figure 1K:
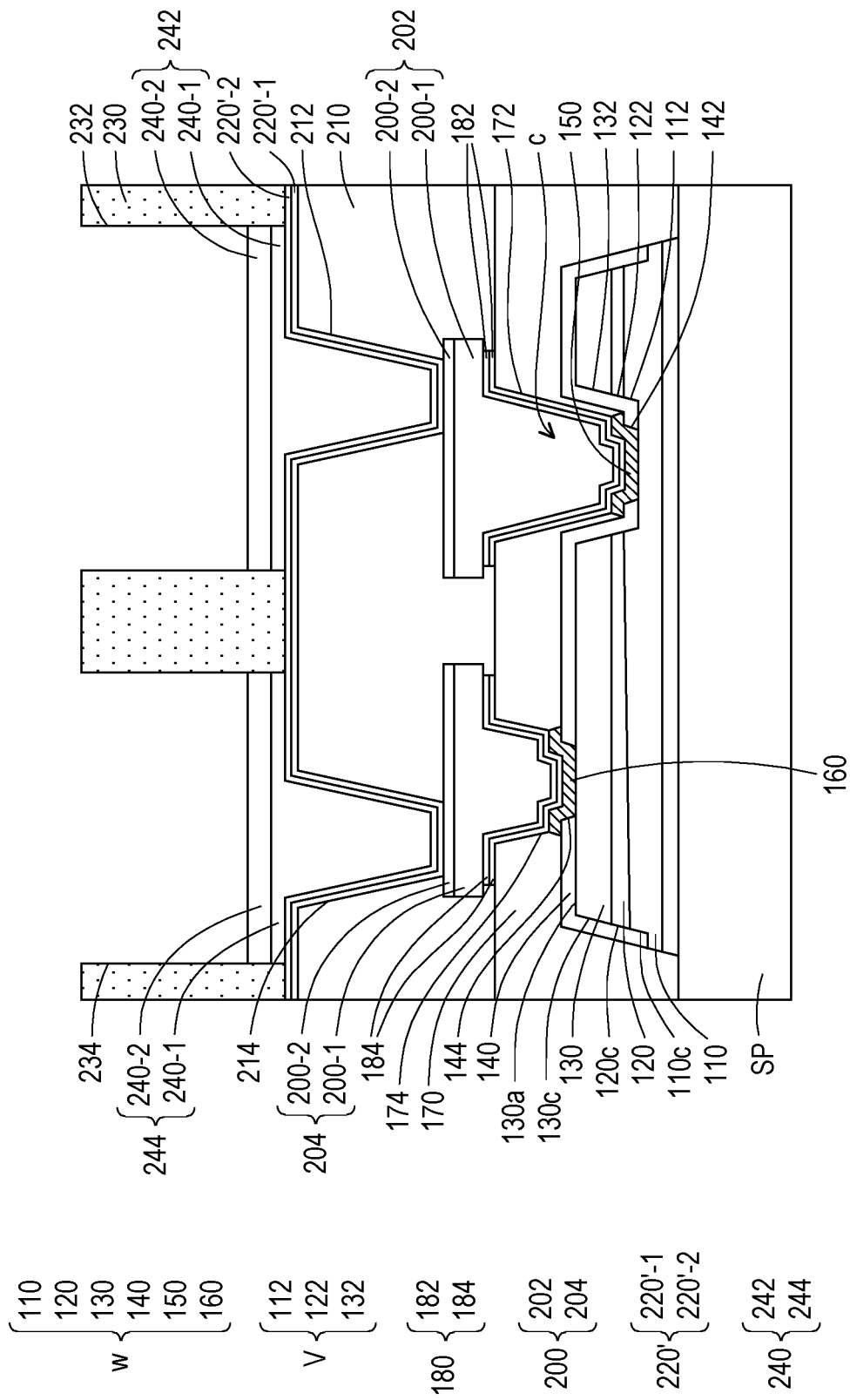
Figure 1L:
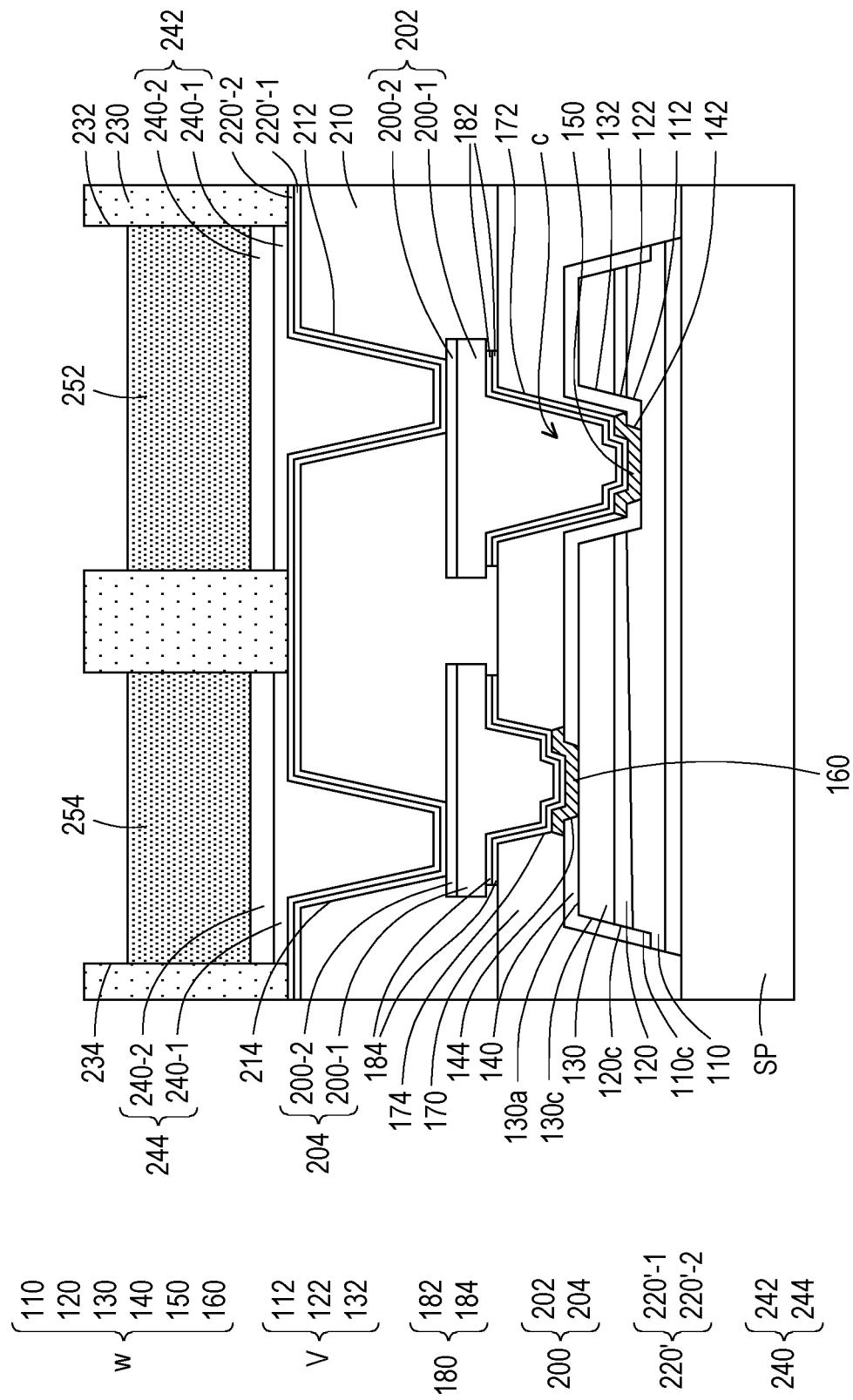
Figure 1M:
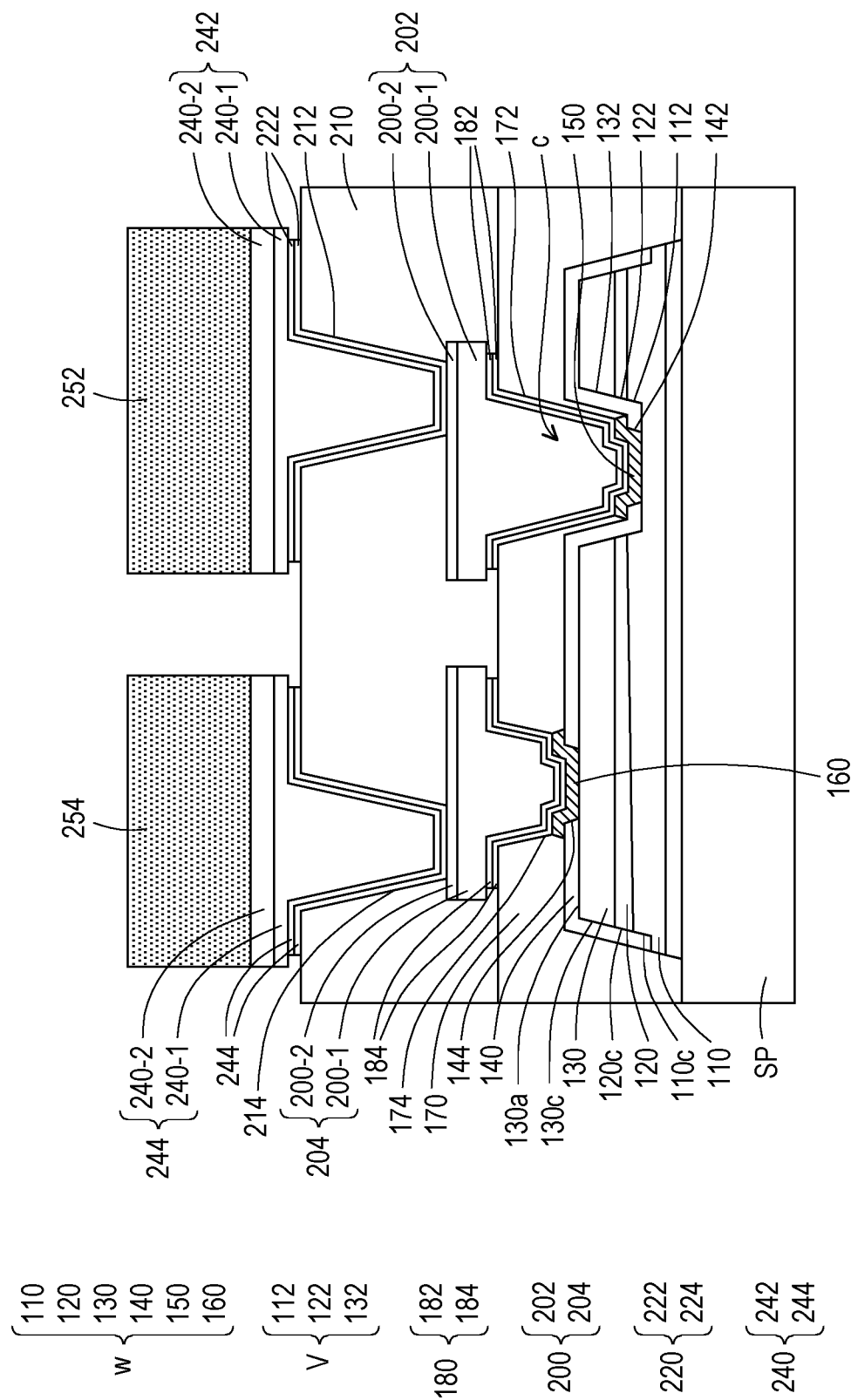
Figure 1N:
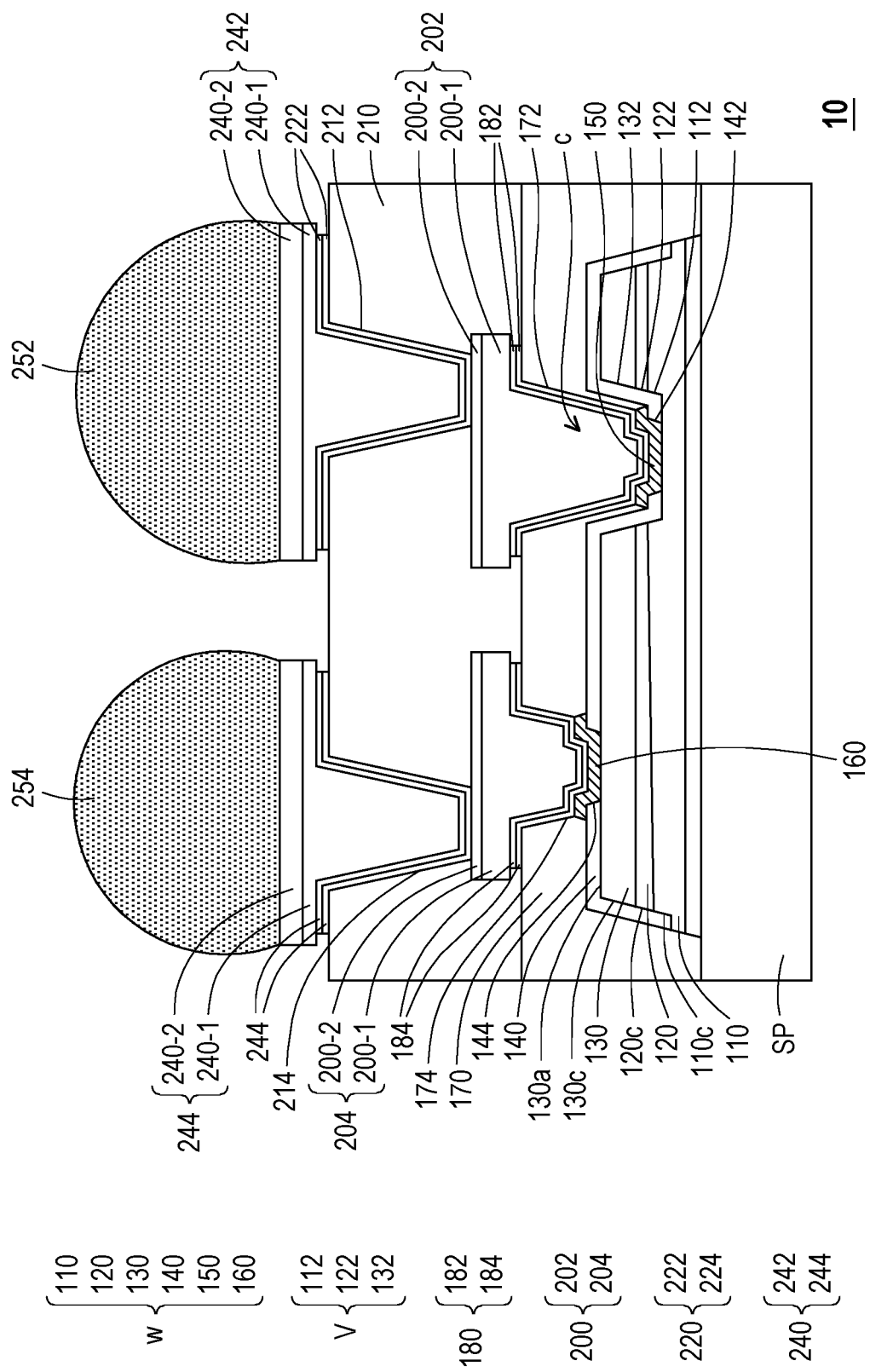

FIG. 1A to FIG. 1N are cross-sectional schematic views showing a manufacturing process of a light-emitting diode element 10 according to an embodiment of the disclosure.

Referring to FIG. 1A, first, a light-emitting diode wafer W is provided, and the light-emitting diode wafer W has a light-emitting diode die w. The light-emitting diode die w includes a first-type semiconductor layer 110 disposed on a growth substrate SP, a second-type semiconductor layer 130 disposed on the first-type semiconductor layer 110, and an active layer 120 disposed between the first-type semiconductor layer 110 and the second-type semiconductor layer 130. The second-type semiconductor layer 130 has a surface 130a facing away from the growth substrate SP. The light-emitting diode die w further includes an insulating layer 140. The insulating layer 140 is disposed on the surface 130a of the second-type semiconductor layer 130 and covers a sidewall 130c of the second-type semiconductor layer 130, a sidewall 120c of the active layer 120, and a sidewall 110c of the first-type semiconductor layer 110. In this embodiment, the insulating layer 140 is, for example, a distributed Bragg reflection layer, but the disclosure is not limited thereto. The light-emitting diode die w further includes a first electrode 150 and a second electrode 160. The first electrode 150 and the second electrode 160 are respectively electrically connected to the first-type semiconductor layer 110 and the second-type semiconductor layer 130.

Specifically, in this embodiment, the insulating layer 140 has a first opening 142 and a second opening 144 respectively overlapping the first-type semiconductor layer 110 and the second-type semiconductor layer 130, and the first electrode 150 and the second electrode 160 are respectively electrically connected to the first-type semiconductor layer 110 and the second-type semiconductor layer 130 through the first opening 142 and the second opening 144 of the insulating layer 140.

For example, in this embodiment, the first-type semiconductor layer 110 has a recess 112, the active layer 120 has a through hole 122, and the second-type semiconductor layer 130 has a through hole 132. The recess 112 of the first-type semiconductor layer 110, the through hole 122 of the active layer 120, and the through hole 132 of the second-type semiconductor layer 130 are overlapped to form a valley V. The first opening 142 of the insulating layer 140 is located in the valley V, the first electrode 150 conformally covers a portion of the first-type semiconductor layer 110 and a portion of the insulating layer 140 located in the valley V. The portion of the insulating layer 140 and the first electrode 150 located in the valley V form a vacancy c of the light-emitting diode die w, but the disclosure is not limited thereto.

Referring to FIG. 1B, next, a first passivation layer 170 is formed to cover the light-emitting diode die w. The first passivation layer 170 has a first opening 172 and a second opening 174 respectively overlapping the first electrode 150 and the second electrode 160. The first passivation layer 170 covers at least a portion of the insulating layer 140 located on the sidewall 130c of the second-type semiconductor layer 130, the sidewall 120c of the active layer 120, and the sidewall 110c of the first-type semiconductor layer 110. In this embodiment, the material of the first passivation layer 170 is, for example, polyimide (PI). However, the disclosure is not limited thereto, and in other embodiments, the first passivation layer 170 may also adopt other insulating materials.

Referring to FIG. 1C, next, a first seed material layer 180' is formed on the first passivation layer 170. The first seed material layer 180' conformally covers the first passivation layer 170 and fills the first opening 172 and the second opening 174 of the first passivation layer 170 to be electrically connected to the first electrode 150 and the second electrode 160 of the light-emitting diode die w.

In this embodiment, the first seed material layer 180' may selectively include multiple seed material sub-layers 180'-1 and 180'-2. The seed material sub-layers 180'-1 and 180'-2 are sequentially formed on the first passivation layer 170. For example, in this embodiment, the materials of the seed material sub-layers 180'-1 and 180'-2 may respectively be titanium (Ti) and copper (Cu), or chromium (Cr) and copper (Cu). However, the disclosure is not limited thereto. In other embodiments, the material of the seed material sub-layers 180'-1 and 180'-2 may also be other conductive materials. In addition, the disclosure does not limit that the first seed material layer 180' must include the seed material sub-layers 180'-1 and 180'-2. In another embodiment, the first seed material layer 180' may also be a single conductive material layer.

Referring to FIG. 1D, next, a first photoresist layer 190 is formed on the first seed material layer 180'. The first photoresist layer 190 has a first opening 192 and a second opening 194, and the first opening 192 and the second opening 194 of the first photoresist layer 190 respectively overlap with multiple portions of the first seed material layer 180' located on the first opening 172 and the second opening 174 of the first passivation layer 170.

Referring to FIG. 1E, next, the first photoresist layer 190 is used as a mask during electroplating to form a first electroplating layer 200 on the first seed material layer 180'. The first electroplating layer 200 is disposed on the first seed material layer 180', and has a first conductive pattern 202 and a second conductive pattern 204 that are structurally separated from one another. In this embodiment, the first electroplating layer 200 may include multiple sub-electroplating layers 200-1 and 200-2 sequentially formed on the first seed material layer 180'. For example, in this embodiment, the materials of the sub-electroplating layers 200-1 and 200-2 may respectively be copper (Cu) and nickel (Ni). However, the disclosure is not limited thereto. In other embodiments, the materials of the sub-electroplating layers 200-1 and 200-2 may also be other conductive materials. In addition, the disclosure does not limit that the first electroplating layer 200 must include the sub-electroplating layers 200-1 and 200-2. In another embodiment, the first electroplating layer 200 may also be a single conductive material layer.

Referring to FIG. 1F, next, the first photoresist layer 190 is removed. Referring to FIG. 1F and FIG. 1G, next, using the first electroplating layer 200 as a hard mask, the first seed material layer 180' is patterned to form a first seed layer 180.

Referring to FIG. 1G, the first seed layer 180 is disposed on the first passivation layer 170, and has a first conductive pattern 182 and a second conductive pattern 184 that are structurally separated from one another. The first conductive pattern 182 and the second conductive pattern 184 of the first seed layer 180 are respectively electrically connected to the first electrode 150 and the second electrode 160 of the light-emitting diode die w through the first opening 172 and the second opening 174 of the first passivation layer 170. The first conductive pattern 202 and the second conductive pattern 204 of the first electroplating layer 200 are respectively disposed on the first conductive pattern 182 and the second conductive pattern 184 of the first seed layer 180 and are respectively electrically connected to the first conductive pattern 182 and the second conductive pattern 184 of the first seed layer 180. In this embodiment, the first conductive pattern 182 of the first seed layer 180 is etched by using the first conductive pattern 202 of the first electroplating layer 200 as a hard mask. Due to the undercut effect during etching, the first conductive pattern 182 of the first seed layer 180 at the bottom is slightly smaller than the first conductive pattern 202 of the first electroplating layer 200 at the top; similarly, the second conductive pattern 184 of the first seed layer 180 at the bottom is also slightly smaller than the second conductive pattern 204 of the first electroplating layer 200 at the top.

Referring to FIG. 1H, next, a second passivation layer 210 is formed to cover a portion of the first electroplating layer 200 and the first passivation layer 170. The second passivation layer 210 is disposed on the first electroplating layer 200 and the first passivation layer 170, and has a first opening 212 and a second opening 214 respectively overlapping the first conductive pattern 202 and the second conductive pattern 204 of the first electroplating layer 200. In this embodiment, the material of the second passivation layer 210 is, for example, benzocyclobutene polymer (BCB). However, the disclosure is not limited thereto, and in other embodiments, the second passivation layer 210 may also adopt other insulating materials.

Referring to FIG. 1I, next, a second seed material layer 220' is formed on the second passivation layer 210. The second seed material layer 220' conformally covers the second passivation layer 210 and fills the first opening 212 and the second opening 214 of the second passivation layer 210 to be electrically connected to the first conductive pattern 202 and the second conductive pattern 204 of the first electroplating layer 200.

In this embodiment, the second seed material layer 220' may selectively include multiple seed material sub-layers 220'-1 and 220'-2. The seed material sub-layers 220'-1 and 220'-2 are sequentially formed on the first passivation layer 170. For example, in this embodiment, the materials of the seed material sub-layers 220'-1 and 220'-2 may respectively be titanium (Ti) and copper (Cu), or chromium (Cr) and copper (Cu). However, the disclosure is not limited thereto. In other embodiments, the material of the seed material sub-layers 220'-1 and 220'-2 may also be other conductive materials. In addition, the disclosure does not limit that the second seed material layer 220' must include the seed material sub-layers 220'-1 and 220'-2. In another embodiment, the second seed material layer 220' may also be a single conductive material layer.

Referring to FIG. 1J, next, a second photoresist layer 230 is formed on the second seed material layer 220'. The first photoresist layer 230 has a first opening 232 and a second opening 234, and the first opening 232 and the second opening 234 of the second photoresist layer 230 respectively overlap with multiple portions of the second seed material layer 220' located on the first opening 212 and the second opening 214 of the second passivation layer 210.

Referring to FIG. 1K, next, the second photoresist layer 230 is used as a mask during electroplating to form a second electroplating layer 240 on the second seed material layer 220'. The second electroplating layer 240 is disposed on the second seed material layer 220', and has a first conductive pattern 242 and a second conductive pattern 244 that are structurally separated from one another. In this embodiment, the second electroplating layer 240 may include multiple sub-electroplating layers 240-1 and 240-2 sequentially formed on the second seed material layer 220'. For example, in this embodiment, the materials of the sub-electroplating layers 240-1 and 240-2 may respectively be copper (Cu) and nickel (Ni). However, the disclosure is not limited thereto. In other embodiments, the materials of the sub-electroplating layers 240-1 and 240-2 may also be other conductive materials. In addition, the disclosure does not limit that the second electroplating layer 240 must include the sub-electroplating layers 240-1 and 240-2. In another embodiment, the first electroplating layer 240 may also be a single conductive material layer.

Referring to FIG. 1L, next, a first solder 252 and a second solder 254 are respectively formed on the first conductive pattern 242 and the second conductive pattern 244 of the second electroplating layer 240. The first solder 252 and the second solder 254 are respectively electrically connected to the first conductive pattern 202 and the second conductive pattern 204 of the first electroplating layer 200. Specifically, in this embodiment, the first solder 252 and the second solder 254 are respectively in electrical contact with the first conductive pattern 242 and the second conductive pattern 244 of the second electroplating layer 240. The first solder 252 and the second solder 254 are respectively electrically connected to the first conductive pattern 202 and the second conductive pattern 204 of the first electroplating layer 200 through the first conductive pattern 242 and the second conductive pattern 244 of the second electroplating layer 240. In this embodiment, the materials of the first solder 252 and the second solder 254 include, for example, tin (Sn) and silver (Ag). However, the disclosure is not limited thereto, and in other embodiments, the materials of the first solder 252 and the second solder 254 may also include other materials.

Referring to FIG. 1L and FIG. 1M, next, the second photoresist layer 230 is removed, and then the first solder 252, the first conductive pattern 242 of the second electroplating layer 240 under the first solder 252, the second solder 254, and the second conductive pattern 244 of the second electroplating layer 240 under the second solder 254 are used as a hard mask, and the second seed material layer 220' is patterned to form the second seed layer 220.

Referring to FIG. 1M, the second seed layer 220 is disposed on the second passivation layer 210, and has a first conductive pattern 222 and a second conductive pattern 224 that are structurally separated from one another. The first conductive pattern 222 and the second conductive pattern 224 of the second seed layer 220 are respectively electrically connected to the first conductive pattern 202 and the second conductive pattern 224 of the first electroplating layer 200 through the first opening 212 and the second opening 214 of the second passivation layer 210. The first conductive pattern 242 and the second conductive pattern 244 of the second electroplating layer 240 are respectively disposed on the first conductive pattern 222 and the second conductive pattern 224 of the second seed layer 220 and are respectively electrically connected to the first conductive pattern 222 and the second conductive pattern 224 of the second seed layer 220. In this embodiment, the first conductive pattern 222 of the second seed layer 220 is etched by using the first conductive pattern 242 of the second electroplating layer 240 as a hard mask. Due to the undercut effect during etching, the first conductive pattern 222 of the second seed layer 220 at the bottom is slightly smaller than the first conductive pattern 242 of the second electroplating layer 240 at the top; similarly, the second conductive pattern 224 of the second seed layer 220 at the bottom is also slightly smaller than the second conductive pattern 244 of the second electroplating layer 240 at the top.

Referring to FIG. 1N, next, a reflow process is performed to re-solder the first solder 252 and the second solder 254 on the first conductive pattern 242 and the second conductive pattern 224 of the second electroplating layer 240. The first solder 252 and the second solder 254 directly contact the first conductive pattern 242 and the second conductive pattern 244 of the second electroplating layer 240. Here, the light-emitting diode element 10 of this embodiment is completed.

It is worth mentioning that, through the first passivation layer 170, and the first conductive pattern 202 and the second conductive pattern 204 of the first electroplating layer 200 filled in the first opening 172 and the second opening 174 of the first passivation layer 170, the vacancy c of the light-emitting diode die w may be leveled. Therefore, in the subsequent process of bonding the light-emitting diode element 10 and the driving backplane 20 (refer to FIG. 3B), voids are less likely to appear at the junction between the light-emitting diode element 10 and the driving backplane 20, and further as a result, the reliability of the display apparatus 1 (refer to FIG. 3E) is improved.

In addition, since the light-emitting diode element 10 includes the first passivation layer 170, and the first passivation layer 170 covers at least a portion of the insulating layer 140 located on the sidewall 130c of the second-type semiconductor layer 130, the sidewall 120c of the active layer 120, and the sidewall 110c of the first-type semiconductor layer 110, therefore, in the subsequent process of bonding the light-emitting diode element 10 and the driving backplane 20, the first solder 252 and the second solder 254 do not easily penetrate into the insulating layer 140 and cause micro-leakage problems.

Figure 2:
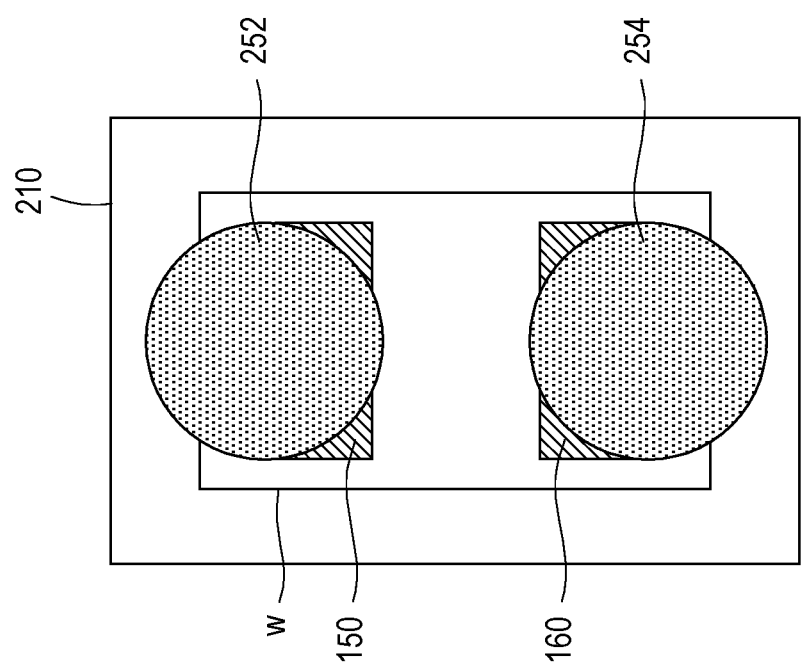
FIG. 2 is a top schematic view of the light-emitting diode element 10 according to an embodiment of the disclosure.

FIG. 2 is a top schematic view of the light-emitting diode element 10 according to an embodiment of the disclosure. FIG. 2 illustrates the first solder 252, the second solder 254, the light-emitting diode die w, the first electrode 150, the second electrode 160, and the second passivation layer 210, and other components of the light-emitting diode element 10 are omitted.

Referring to FIG. 1N and FIG. 2, in this embodiment, the first conductive pattern 202 and the second conductive pattern 204 of the first electroplating layer 200 are, for example, multiple traces respectively electrically connected to the first electrode 150 and the second electrode 160 of the light-emitting diode die w. The first conductive pattern 242 and the second conductive pattern 244 of the second electroplating layer 240 are, for example, multiple pads respectively in contact with the first solder 252 and the second solder 254. Through the traces (for example: the first conductive pattern 202 and the second conductive pattern 204 of the first electroplating layer 200), the pads (for example: the first conductive pattern 242 and the second conductive pattern 244 of the second electroplating layer 240) may be disposed in a wider layout space, so that the areas of the pads are respectively much larger than the first electrode 150 and the second electrode 160 of the light-emitting diode die w. That is, more first solders 252 and more second solders 254 may be disposed on the pads of the light-emitting diode element 10. In this way, in the subsequent process, the bonding force between the light-emitting diode element and the driving backplane 20 (refer to FIG. 3B) may be stronger, and the reliability of the display apparatus 1 (refer to FIG. 3E) may be further improved.

However, the disclosure is not limited thereto. In another embodiment, if the first conductive pattern 202 and the second conductive pattern 204 of the first electroplating layer 200 may be disposed in a wider layout space, the first conductive pattern 202 and the second conductive pattern 204 of the first electroplating layer 200 may be used as large-area pads, and the first solder 252 and the second solder 254 are directly disposed on the first conductive pattern 202 and the second conductive pattern 204 of the first electroplating layer 200; in this case, the disposition of the second passivation layer 210, the second seed layer 220, and the second electroplating layer 240 may be omitted.

In addition, in this embodiment, due to the strong bonding force between the light-emitting diode element 10 and the driving backplane 20 (refer to FIG. 3B), if the display device 1 (refer to FIG. 3E) formed by the bonding of the light-emitting diode element 10 and the driving backplane 20 needs to be repaired, when removing the defective light-emitting diode element 10 by using an extractor (not shown), although the extractor contacts both the defective light-emitting diode element 10 and a normal light-emitting diode element 10 at the same time, the extractor may not easily pull up the normal light-emitting diode element 10. Therefore, the repair yield rate of the display apparatus 1 (refer to FIG. 3E) is high.

FIG. 3A to FIG. 3E are cross-sectional schematic views showing a manufacturing process of a display apparatus 1 according to an embodiment of the disclosure.

Figure 3A:
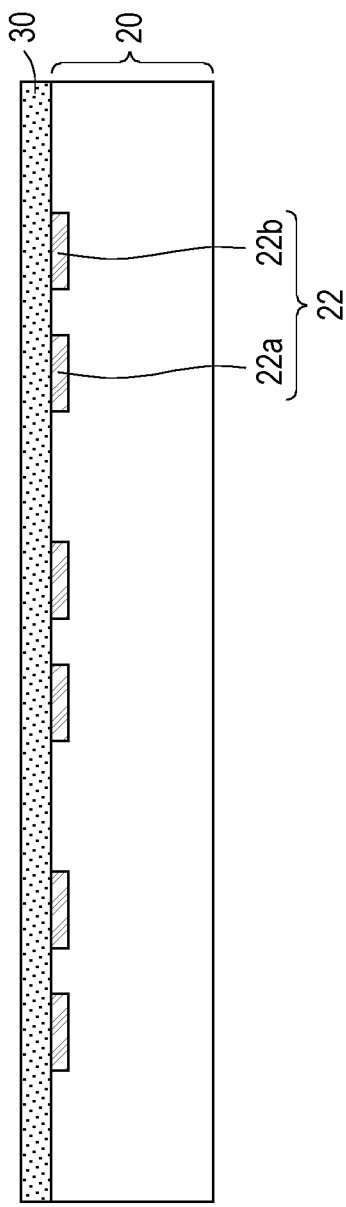
FIG. 3A to FIG. 3E are cross-sectional schematic views showing a manufacturing process of a display apparatus 1 according to an embodiment of the disclosure.

Referring to FIG. 3A, first, a driving backplane 20 is provided, in which the driving backplane 20 has multiple pad groups 22. Specifically, in this embodiment, the driving backplane 20 has multiple pixel driving circuits (not shown), and each of the pad groups 22 is electrically connected to a corresponding pixel driving circuit. For example, in this embodiment, each of the pad groups 22 includes multiple pads 22a, 22b, and each of the pixel driving circuits may include a data line (not shown), a scan line (not shown), a power line (not shown), a common line (not shown), a first transistor (not shown), a second transistor (not shown), and a capacitor (not shown). The first terminal of the first transistor is electrically connected to the data line, the control terminal of the first transistor is electrically connected to the scan line, the second terminal of the first transistor is electrically connected to the control terminal of the second transistor, and the first terminal of the second transistor is electrically connected to the power line. The capacitor is electrically connected to the second terminal of the first transistor and the first terminal of the second transistor, the pads 22a and the pads 22b of each of the pad groups 22 may be respectively electrically connected to the second terminal of the second transistor of a corresponding one of the pixel driving circuits and the common line, but the disclosure is not limited thereto.

Referring to FIG. 3A, next, a temporary adhesive layer 30 is formed on the driving backplane 20. The composition of the temporary adhesion layer 30 includes soldering flux. In this embodiment, the temporary adhesive layer 30 is colorless and transparent; the material of the temporary adhesive layer 30 includes low molecular weight polymers; the viscosity coefficient of the temporary adhesive layer 30 may fall within the range of 50 Pa·s to 10000 Pa·s; the boiling point of the temporary adhesive layer 30 may be lower than 260° C.; however, the disclosure is not limited thereto.

Figure 3B:
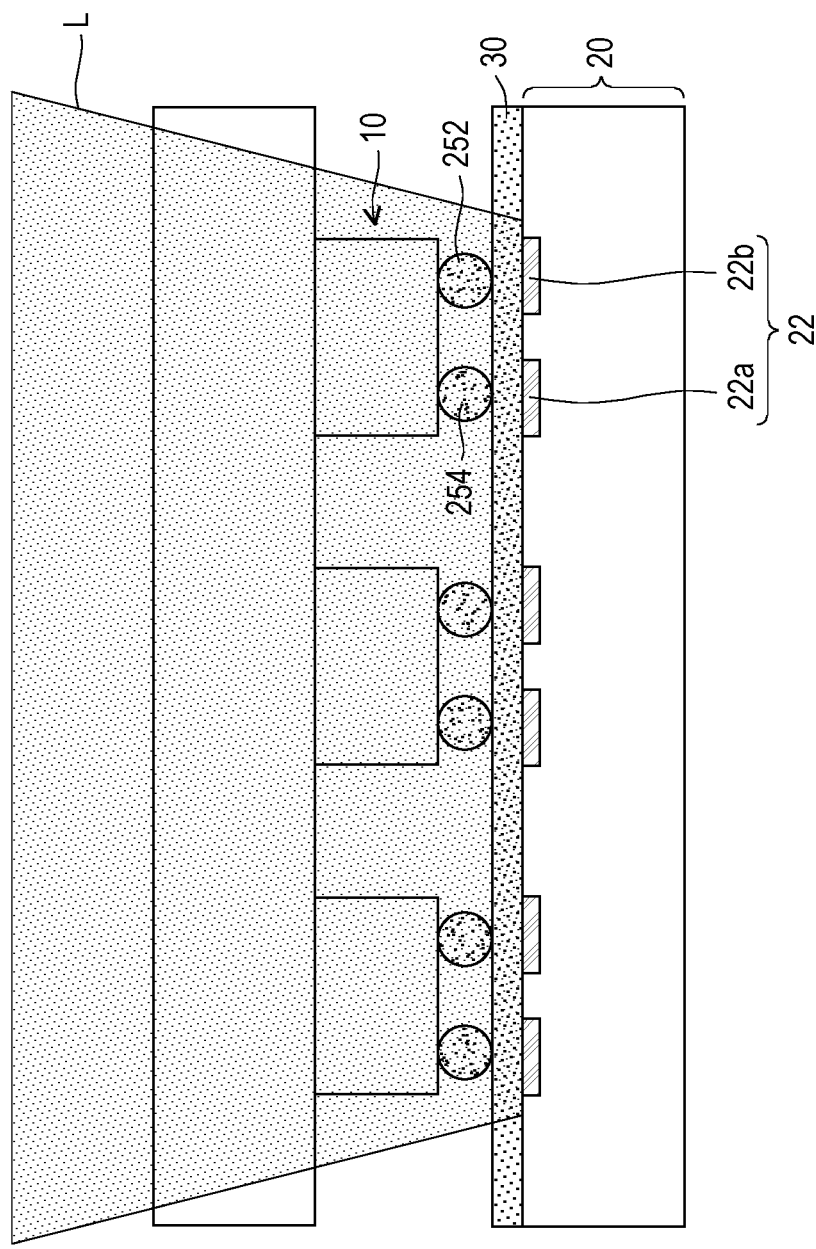
Figure 3C:
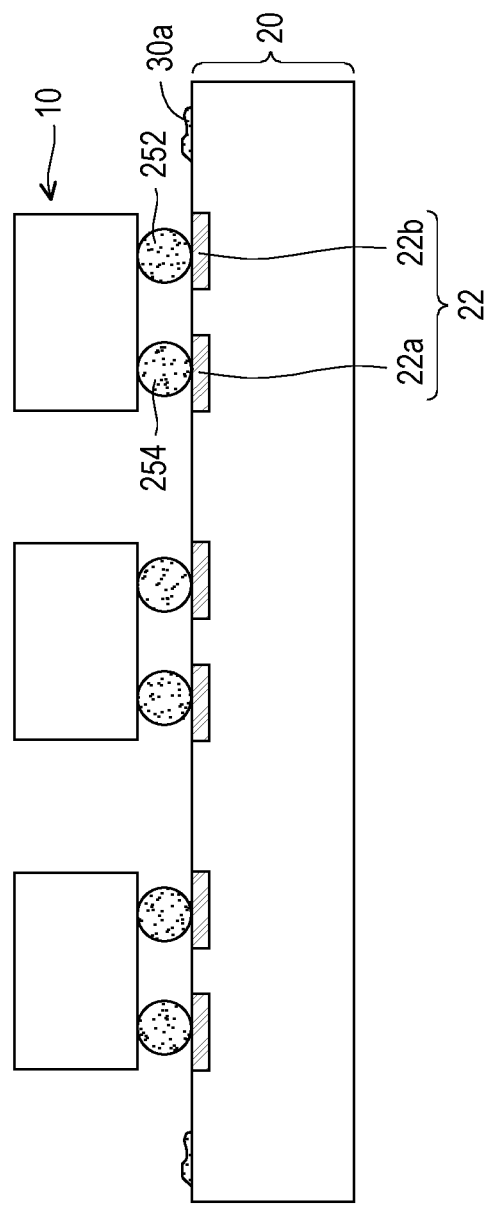

Referring to FIG. 3B and FIG. 3C, after the temporary adhesive layer 30 is formed on the driving backplane 20, multiple light-emitting diode elements 10 are then placed on the driving backplane 20, and the light emitting diode elements 10 are electrically connected to the pad groups 22 of the driving backplane 20. For example, in this embodiment, the first solder 252 and the second solder 254 of each of the light-emitting diode elements 10 may be electrically connected to multiple pads 22b and 22a of the corresponding one of the pad groups 22 by using the laser bonding technology. In this embodiment, in the process of bonding the light-emitting diode element 10 and the pad group 22, most of the temporary adhesive layer 30 is volatilized and removed by heat. However, after the light-emitting diode element 10 is bonded to the pad group 22, a portion 30a of the temporary adhesive layer 30 remains on the driving backplane 20.

Figure 3D:
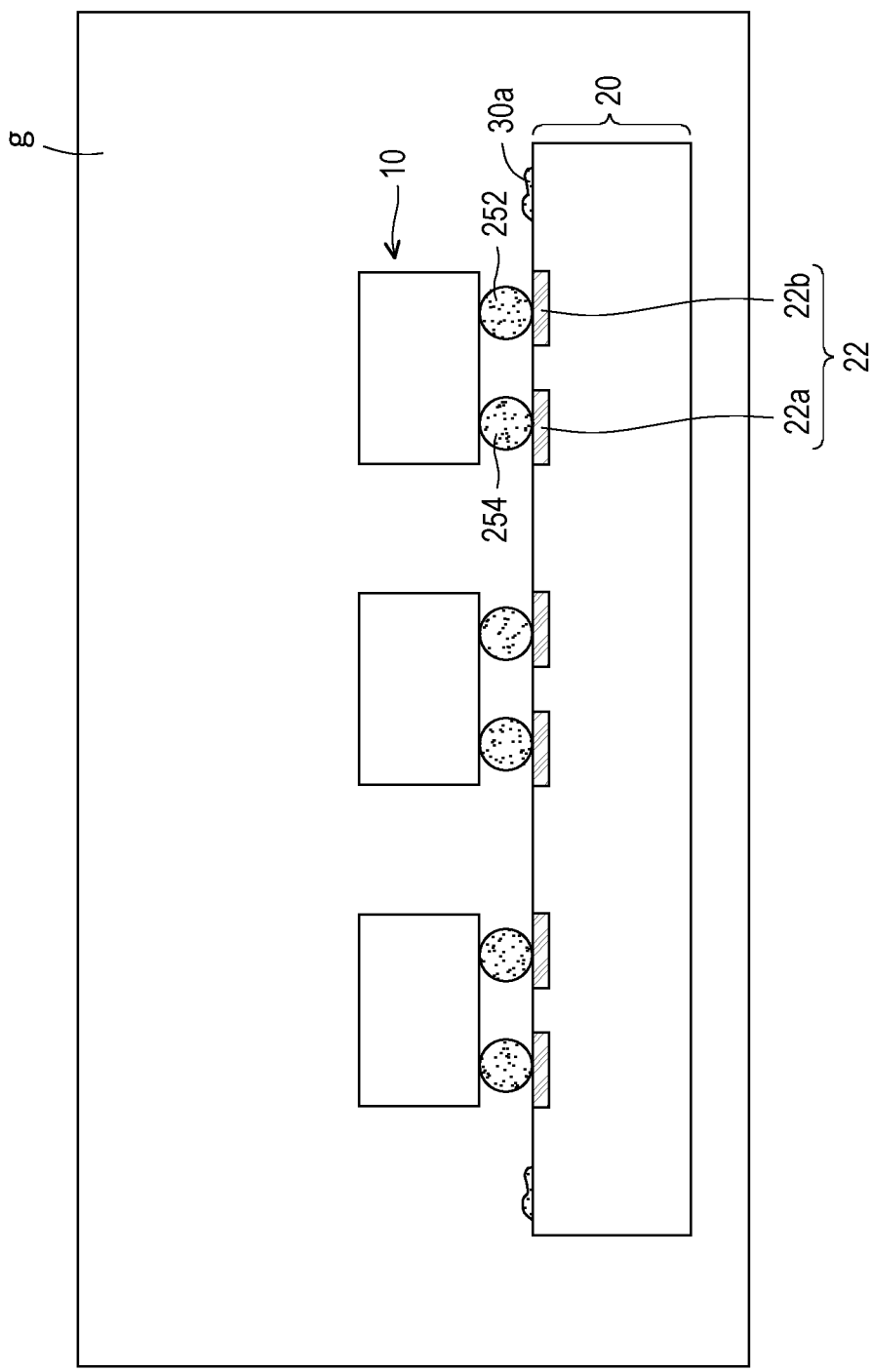
Figure 3E:
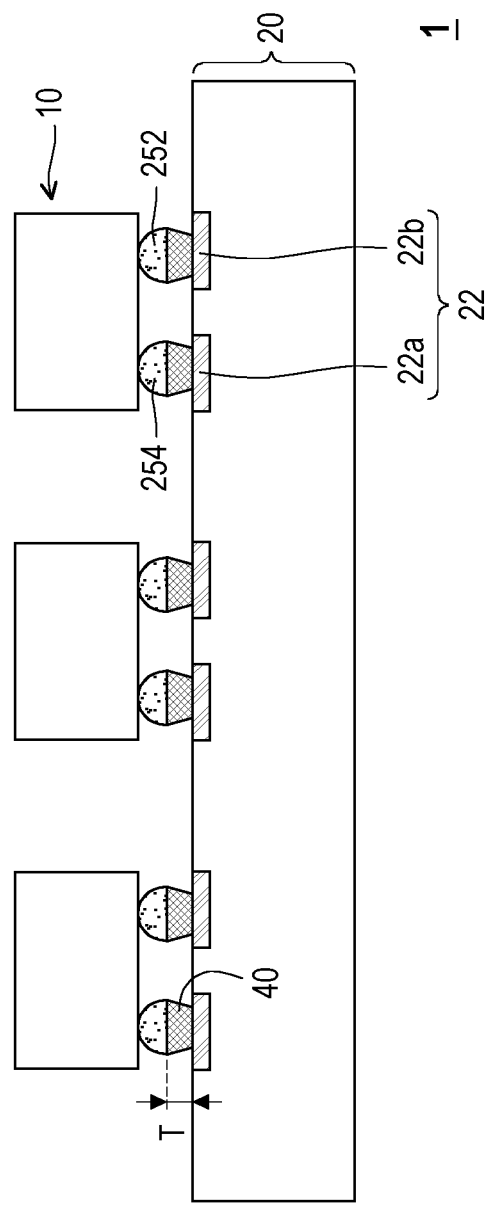

Referring to FIG. 3D and FIG. 3E, a reflow process is then performed, so that the light-emitting diode elements 10 are self-aligned to the pad groups 22 of the driving backplane 20.

Figure 4A:
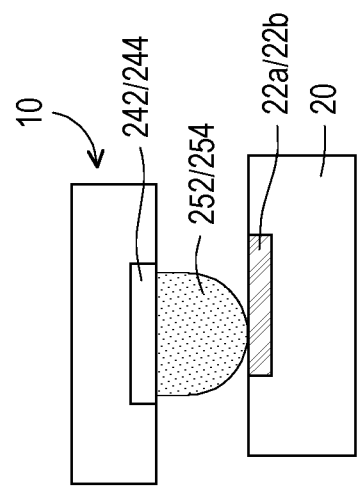
FIG. 4A to FIG. 4C show the process of self-aligning a first solder 252/second solder 254 of the light-emitting diode element 10 and a pad 22a/22b of a driving backplane 20 according to an embodiment of the disclosure.
Figure 4B:
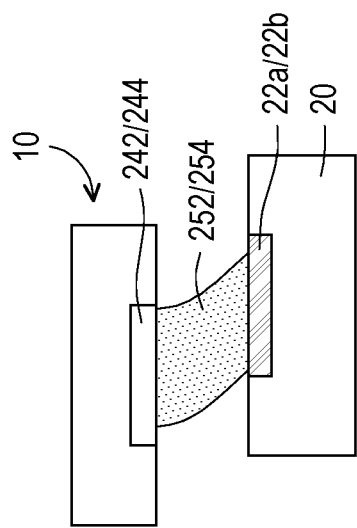
Figure 4C:
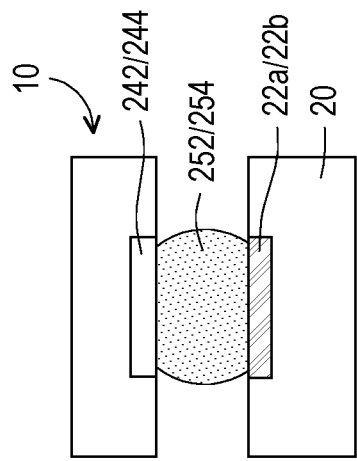

FIG. 4A to FIG. 4C show the process of self-aligning a first solder 252/second solder 254 of the light-emitting diode element 10 and a pad 22a/22b of a driving backplane 20 according to an embodiment of the disclosure. Referring to FIG. 4A, in this embodiment, in the process of bonding the light-emitting diode element 10 and the pad group 22 corresponding to FIG. 3B, the first solder 252/second solder 254 of the light-emitting diode element 10 is roughly aligned and bonded with the pads 22b/22a of the pad group 22 first. Referring to FIG. 4B, then, in the reflow process corresponding to FIG. 3D, the first solder 252/second solder 254 is heated and becomes liquid. Referring to FIG. 4C, using the cohesive force of the liquid first solder 252/second solder 254, during the process of the first solder 252/second solder 254 recovering from a liquid state to a solid state, the light-emitting diode element 10 may be pulled back onto the pads 22b/22a with the redistribution of the first solder 252/second solder 254 to complete the self-alignment. Through the above-mentioned self-alignment, the initial alignment accuracy of the light-emitting diode element 10 and the pad set 22 corresponding to FIG. 3B does not need to be too high. However, after the self-alignment is completed, finally, the light-emitting diode element 10 may still be accurately bonded to the pads 22a/22b. Here, the display apparatus 1 of this embodiment is completed.

For example, in this embodiment, the heating temperature range of the reflow process corresponding to FIG. 3D may fall within 160° C. to 260° C., and the heating time range corresponding to the reflow process of FIG. 3D may fall within 1 minute to 8 minutes, but the disclosure is not limited thereto.

Referring to FIG. 3D, in this embodiment, during the reflow process, gas g may also be introduced to remove a portion 30a of the temporary adhesive layer 30 remaining on the driving backplane 20. Specifically, the portion 30a of the temporary adhesive layer 30 remaining on the driving backplane 20 undergoes a redox reaction with the gas g, and thus is removed from the driving backplane 20. By using the gas g to remove the portion 30a of the temporary adhesive layer 30 including the soldering flux, the light-emitting diode element 10 may be less likely to fall off the driving backplane 20 during the soldering flux removal process, thereby improving the yield rate. For example, in this embodiment, during the reflow process, the gas g introduced may include hydrogen gas or formic acid, but the disclosure is not limited thereto.

In addition, compared with the manufacturing process of a general display apparatus, the manufacturing process of the display apparatus 1 of this embodiment has an extra reflow process corresponding to FIG. 3D. That is to say, the first solder 252/second solder 254 and the pad 22b/pad 22a of the light-emitting diode element 10 have one extra eutectic bonding step. Therefore, in the finally formed display apparatus 1, a thickness T of an intermetallic compound (drawn in FIG. 3E) formed by the eutectic of the first solder 252/second solder 254 of the light-emitting diode element 10 and the pads 22b/22a of the driving backplane 20 is thicker. For example, in this embodiment, the thickness T of the intermetallic compound 40 may be greater than 1 μm, but the disclosure is not limited thereto.

It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 5:
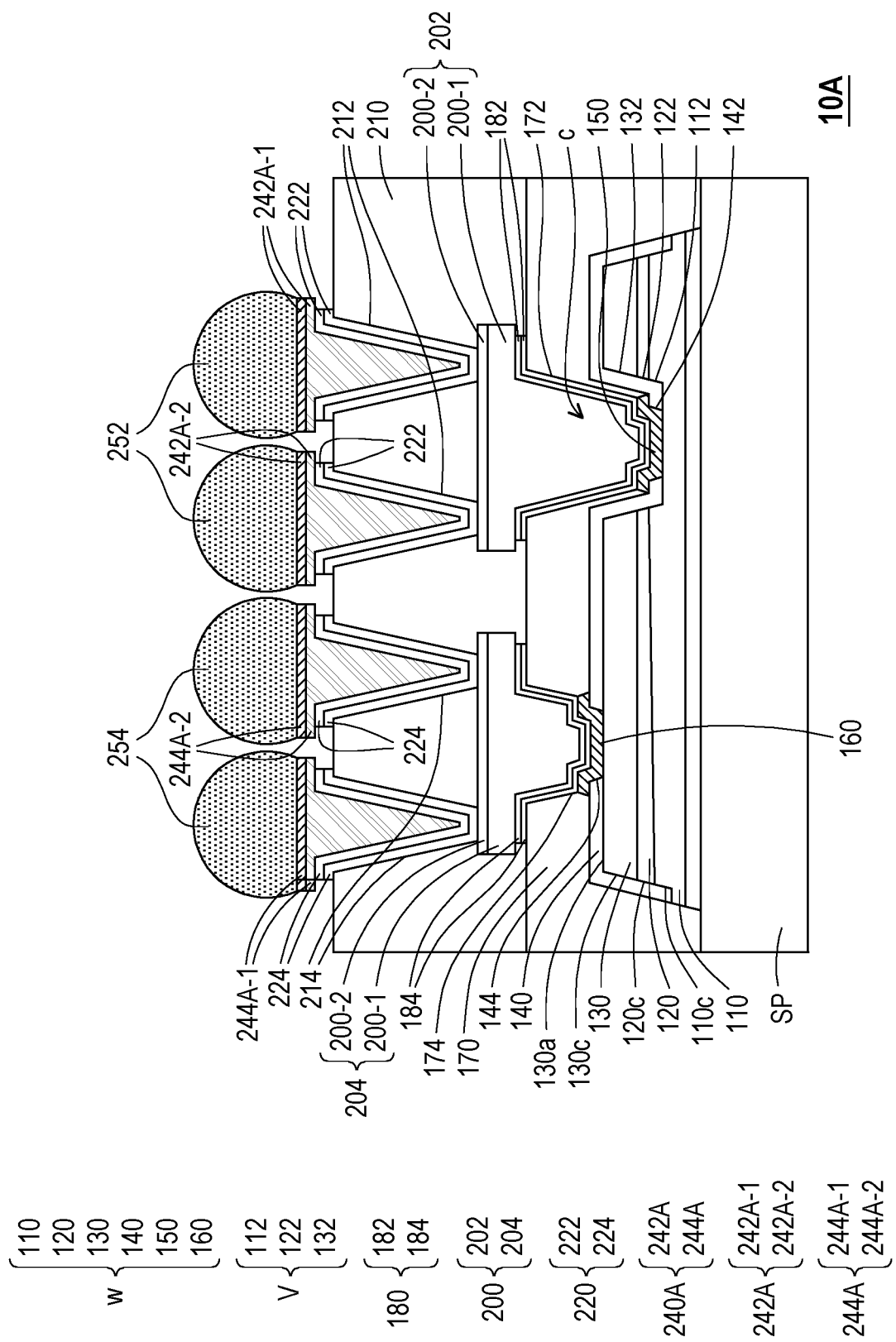
FIG. 5 is a cross-sectional schematic view of a light-emitting diode element 10A according to another embodiment of the disclosure.

FIG. 5 is a cross-sectional schematic view of a light-emitting diode element 10A according to another embodiment of the disclosure.

The light-emitting diode element 10A of FIG. 5 is similar to the light-emitting diode element 10 of FIG. 1N, and the main difference between the two is: the first conductive pattern 242A and the second conductive pattern 244A of the second electroplating layer 240A of the light emitting diode element 10A of FIG. 5 is different from the first conductive pattern 242 and the second conductive pattern 244 of the second electroplating layer 240 of the light emitting diode element 10 of FIG. 1N.

Referring to FIG. 5, specifically, in this embodiment, the first conductive pattern 242A of the second electroplating layer 240A includes a first portion 242A-1 and a second portion 242A-2 that are structurally separated from one another. The first portion 242A-1 and the second portion 242A-2 of the first conductive pattern 242A of the second electroplating layer 240A are electrically connected to the same first conductive pattern 202 of the first electroplating layer 200. The second conductive pattern 244A of the second electroplating layer 240A includes a first portion 244A-1 and a second portion 244A-2 that are structurally separated from one another. The first portion 244A-1 and the second portion 244A-2 of the second conductive pattern 244A of the second electroplating layer 240A are electrically connected to the same second conductive pattern 204 of the first electroplating layer 200.

In other words, compared to the light-emitting diode element 10 of FIG. 1N, the number of pads of the light-emitting diode element 10A of FIG. 5 (i.e., the first portion 242A-1 and the second portion 242A-2 of the first conductive pattern 242A, and the first portion 244A-1 and the second portion 244A-2 of the second conductive pattern 244A) is larger, and through the larger number of pads, a larger amount of the first solder 252 and the second solder 254 may also be disposed on the pads of the light-emitting diode element 10A. In this way, the purpose of increasing the bonding force and self-alignment capability of the light-emitting diode element 10A and the driving backplane 20 (refer to FIG. 3E) may also be achieved.

What is claimed is:

1. A light-emitting diode element, comprising:
a first-type semiconductor layer;
a second-type semiconductor layer, disposed on the first-type semiconductor layer;
an active layer, disposed between the first-type semiconductor layer and the second-type semiconductor layer;
an insulating layer, disposed on a surface of the second-type semiconductor layer and covering a sidewall of the first-type semiconductor layer, a sidewall of the second-type semiconductor layer, and a sidewall of the active layer;
a first electrode and a second electrode, respectively electrically connected to the first-type semiconductor layer and the second-type semiconductor layer;
a first passivation layer, covering at least a portion of the insulating layer located on the sidewall of the first-type semiconductor layer and the sidewall of the second-type semiconductor layer, and having a first opening and a second opening respectively overlapping the first electrode and the second electrode;
a first seed layer, disposed on the first passivation layer, and having a first conductive pattern and a second conductive pattern that are structurally separated from one another, wherein the first conductive pattern and the second conductive pattern of the first seed layer are respectively electrically connected to the first electrode and the second electrode through the first opening and the second opening of the first passivation layer;
a first electroplating layer, disposed on the first seed layer, and having a first conductive pattern and a second conductive pattern that are structurally separated from one another, wherein the first conductive pattern and the second conductive pattern of the first electroplating layer are respectively disposed on the first conductive pattern and the second conductive pattern of the first seed layer and are respectively electrically connected to the first conductive pattern and the second conductive pattern of the first seed layer; and
a first solder and a second solder, respectively electrically connected to the first conductive pattern and the second conductive pattern of the first electroplating layer;
wherein the first conductive pattern of the first seed layer is smaller than the first conductive pattern of the first electroplating layer, and the second conductive pattern of the first seed layer is smaller than the second conductive pattern of the first electroplating layer;

a second passivation layer, disposed on the first electroplating layer and the first passivation layer, and having a first opening and a second opening respectively overlapping the first conductive pattern and the second conductive pattern of the first electroplating layer;

a second seed layer, disposed on the second passivation layer, and having a first conductive pattern and a second conductive pattern that are structurally separated from one another, wherein the first conductive pattern and the second conductive pattern of the second seed layer are respectively electrically connected to the first conductive pattern and the second conductive pattern of the first electroplating layer through the first opening and the second opening of the second passivation layer; and a second electroplating layer, disposed on the second seed layer, and having a first conductive pattern and a second conductive pattern that are structurally separated from one another, wherein the first conductive pattern and the second conductive pattern of the second electroplating layer are respectively disposed on the first conductive pattern and the second conductive pattern of the second seed layer and are respectively electrically connected to the first conductive pattern and the second conductive pattern of the second seed layer;

wherein the first conductive pattern of the second seed layer is smaller than the first conductive pattern of the second electroplating layer, and the second conductive pattern of the second seed layer is smaller than the second conductive pattern of the second electroplating layer.

2. The light-emitting diode element according to claim 1, wherein the first solder and the second solder respectively directly contact the first conductive pattern and the second conductive pattern of the second electroplating layer.

3. The light-emitting diode element according to claim 1, wherein the first conductive pattern of the second electroplating layer comprises a first portion and a second portion that are structurally separated from one another, and the first portion and the second portion of the first conductive pattern of the second electroplating layer are electrically connected to the same first conductive pattern of the first electroplating layer.

4. The light-emitting diode element according to claim 3, wherein the second conductive pattern of the second electroplating layer comprises a first portion and a second portion that are structurally separated from one another, and the first portion and the second portion of the second conductive pattern of the second electroplating layer are electrically connected to the same second conductive pattern of the first electroplating layer.

5. A method for manufacturing a display apparatus, comprising:

providing a driving backplane, wherein the driving backplane has a plurality of pad groups;

forming a temporary adhesive layer on the driving backplane;

after forming the temporary adhesive layer on the driving backplane, placing a plurality of light-emitting diode elements on the driving backplane, and electrically connecting the light-emitting diode elements to the pad groups of the driving backplane; and performing a reflow process so that the light-emitting diode elements self-align to the pad groups of the driving backplane;

wherein each of the light-emitting diode elements comprises:

a first-type semiconductor layer;

a second-type semiconductor layer, disposed on the first-type semiconductor layer;

an active layer, disposed between the first-type semiconductor layer and the second-type semiconductor layer;

an insulating layer, disposed on a surface of the second-type semiconductor layer and covering a sidewall of the first-type semiconductor layer, a sidewall of the second-type semiconductor layer, and a sidewall of the active layer;

a first electrode and a second electrode, respectively electrically connected to the first-type semiconductor layer and the second-type semiconductor layer;

a first passivation layer, covering at least a portion of the insulating layer located on the sidewall of the first-type semiconductor layer and the sidewall of the second-type semiconductor layer, and having a first opening and a second opening respectively overlapping the first electrode and the second electrode;

a first seed layer, disposed on the first passivation layer, and having a first conductive pattern and a second conductive pattern that are structurally separated from one another, wherein the first conductive pattern and the second conductive pattern of the first seed layer are respectively electrically connected to the first electrode and the second electrode through the first opening and the second opening of the first passivation layer;

a first electroplating layer, disposed on the first seed layer, and having a first conductive pattern and a second conductive pattern that are structurally separated from one another, wherein the first conductive pattern and the second conductive pattern of the first electroplating layer are respectively disposed on the first conductive pattern and the second conductive pattern of the first seed layer and are respectively electrically connected to the first conductive pattern and the second conductive pattern of the first seed layer; and a first solder and a second solder, respectively electrically connected to the first conductive pattern and the second conductive pattern of the first electroplating layer;

wherein the first conductive pattern of the first seed layer is smaller than the first conductive pattern of the first electroplating layer, and the second conductive pattern of the first seed layer is smaller than the second conductive pattern of the first electroplating layer;

a second passivation layer, disposed on the first electroplating layer and the first passivation layer, and having a first opening and a second opening respectively overlapping the first conductive pattern and the second conductive pattern of the first electroplating layer;

a second seed layer, disposed on the second passivation layer, and having a first conductive pattern and a second conductive pattern that are structurally separated from one another, wherein the first conductive pattern and the second conductive pattern of the second seed layer are respectively electrically connected to the first conductive pattern and the second conductive pattern of the first electroplating layer through the first opening and the second opening of the second passivation layer; and a second electroplating layer, disposed on the second seed layer, and having a first conductive pattern and a second conductive pattern that are structurally separated from one another, wherein the first conductive pattern and the second conductive pattern of the second electroplating layer are respectively disposed on the first conductive pattern and the second conductive pattern of the second seed layer and are respectively electrically connected to the first conductive pattern and the second conductive pattern of the second seed layer;

wherein the first conductive pattern of the second seed layer is smaller than the first conductive pattern of the second electroplating layer, and the second conductive pattern of the second seed layer is smaller than the second conductive pattern of the second electroplating layer.

6. The method for manufacturing the display apparatus according to claim 5, wherein after electrically connecting the light-emitting diode element to the pad groups of the driving backplane, a portion of the temporary adhesive layer remains on the driving backplane;

when performing the reflow process, removing the portion of the temporary adhesive layer remaining on the driving backplane.

7. The method for manufacturing the display apparatus according to claim 6, wherein the reflow process comprises:

introducing gas to remove the portion of the temporary adhesive layer remaining on the driving backplane.

8. The method for manufacturing the display apparatus according to claim 7, wherein the gas comprises hydrogen or formic acid.

* * * * *